United States Patent
Hirose et al.

(10) Patent No.: US 10,468,232 B2
(45) Date of Patent: Nov. 5, 2019

(54) CHARGED PARTICLE BEAM WRITING APPARATUS AND CHARGED PARTICLE BEAM WRITING METHOD

(71) Applicant: NUFLARE TECHNOLOGY, INC., Kanagawa (JP)

(72) Inventors: Satoru Hirose, Yokohama (JP); Rieko Nishimura, Yokohama (JP); Ryosuke Ueba, Yokohama (JP)

(73) Assignee: NUFLARE TECHNOLOGY, INC., Kanagawa (JP)

( * ) Notice: Subject to any disclaimer, the term of this patent is extended or adjusted under 35 U.S.C. 154(b) by 0 days.

(21) Appl. No.: 15/997,899

(22) Filed: Jun. 5, 2018

(65) Prior Publication Data

US 2019/0027340 A1   Jan. 24, 2019

(30) Foreign Application Priority Data

Jul. 18, 2017  (JP) ................. 2017-138883

(51) Int. Cl.
*H01J 37/302*  (2006.01)
*H01J 37/20*   (2006.01)
*H01J 37/147*  (2006.01)
*H01J 37/317*  (2006.01)

(52) U.S. Cl.
CPC ........ *H01J 37/3026* (2013.01); *H01J 37/147* (2013.01); *H01J 37/20* (2013.01); *H01J 37/3174* (2013.01); *H01J 37/3177* (2013.01); *H01J 2237/30455* (2013.01); *H01J 2237/30472* (2013.01); *H01J 2237/31774* (2013.01); *H01J 2237/31776* (2013.01)

(58) Field of Classification Search
CPC ...... H01J 37/3026; H01J 37/147; H01J 37/20; H01J 37/3174; H01J 37/3177; H01J 2237/30455; H01J 2237/30472; H01J 2237/31774; H01J 2237/31776
USPC ......... 250/396 R, 397, 492.1, 492.2, 492.21, 250/492.22, 492.23, 492.3
See application file for complete search history.

(56) References Cited

U.S. PATENT DOCUMENTS

| | | | | |
|---|---|---|---|---|
| 8,872,139 B2* | 10/2014 | Nishimura | .......... | H01J 37/3174 250/252.1 |
| 2008/0057418 A1* | 3/2008 | Seltmann | ............ | G03F 7/70633 430/30 |
| 2008/0243946 A1* | 10/2008 | Deguchi | ............. | G06F 11/1471 |

(Continued)

FOREIGN PATENT DOCUMENTS

JP   2009-253124 A   10/2009

*Primary Examiner* — Nicole M Ippolito
(74) *Attorney, Agent, or Firm* — Cermak Nakajima & McGowan LLP; Tomoko Nakajima

(57) ABSTRACT

A charged particle beam writing apparatus includes a writing data generation circuitry to input character information or information of an item selected, for specifying an apparatus quality check pattern used for evaluating apparatus quality of a charged particle beam writing apparatus, and to generate writing data of the apparatus quality check pattern based on the character information or the information of the item selected, and a combination circuitry to input writing data of an actual chip pattern to be written on a target object, and to combine the writing data of the actual chip pattern and the writing data of the apparatus quality check pattern such that the actual chip pattern and the apparatus quality check pattern do not overlap with each other.

10 Claims, 21 Drawing Sheets

(56) References Cited

U.S. PATENT DOCUMENTS

| | | | |
|---|---|---|---|
| 2009/0193375 A1* | 7/2009 | Izuha | G06F 17/5068 |
| | | | 716/113 |
| 2015/0324148 A1* | 11/2015 | Achtenberg | G06F 11/1012 |
| | | | 711/103 |
| 2017/0184979 A1* | 6/2017 | Hsu | G03F 1/70 |

* cited by examiner

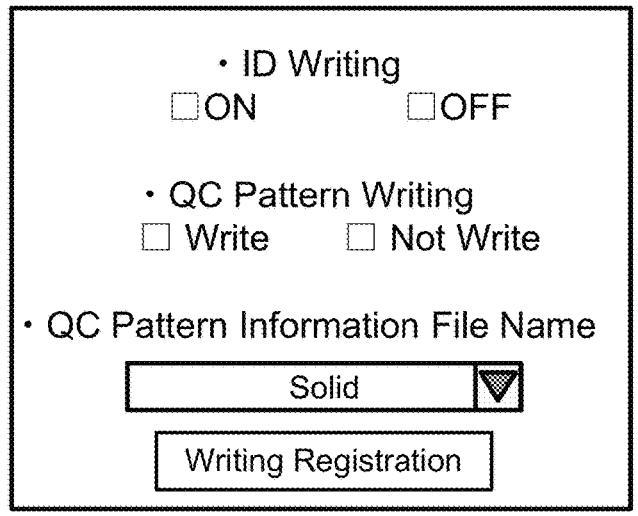

FIG. 10

| QC Pattern Information File Name | Solid |
|---|---|
| 1 | To be combined with ID or not | ON |
| 2 | Reference coordinate X | X1 |
| 3 | Reference coordinate Y | Y1 |
| 4 | Lower left of beam region for QC pattern | 1,1 |
| 5 | Upper right of beam region for QC pattern | m, n |
| 6 | Writing timing | Before: Y, During: Y, After: Y |
| 7 | Writing interval | p × n |
| 8 | Number of writing patterns in X direction | 3 |
| 9 | Number of writing patterns in Y direction | 3 |
| 10 | Reference dose | d1 |
| 11 | Backscatter coefficient | η1 |
| 12 | Perform proximity effect correction or not | ON |
| 13 | Writing pattern type | Solid |

FIG. 11

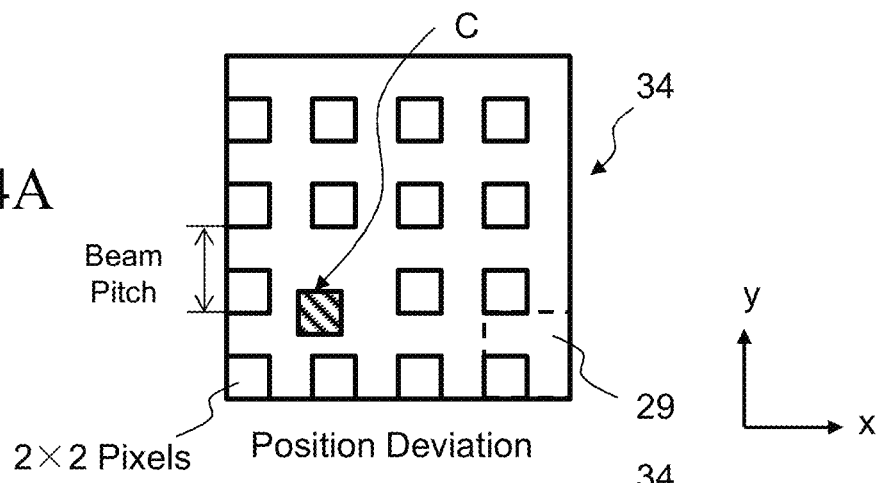
FIG.14A Position Deviation
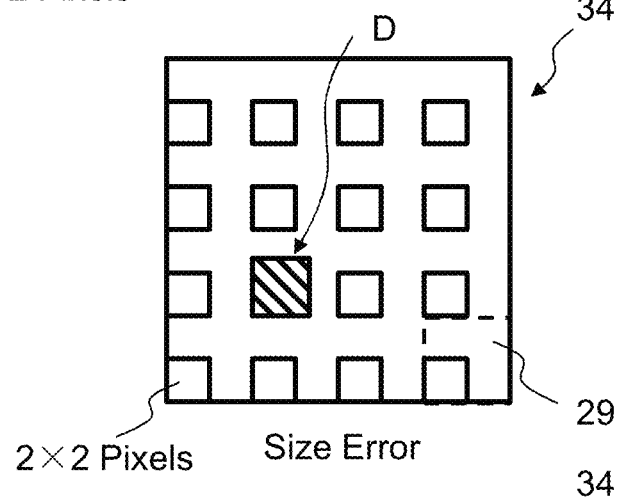
FIG.14B Size Error
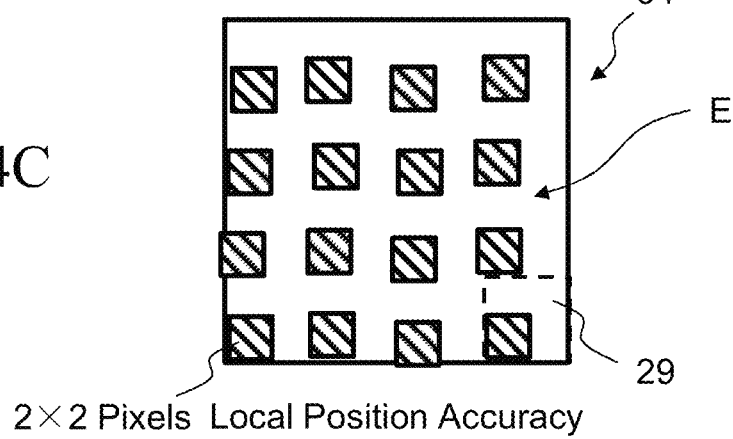
FIG.14C Local Position Accuracy Beam Pitch

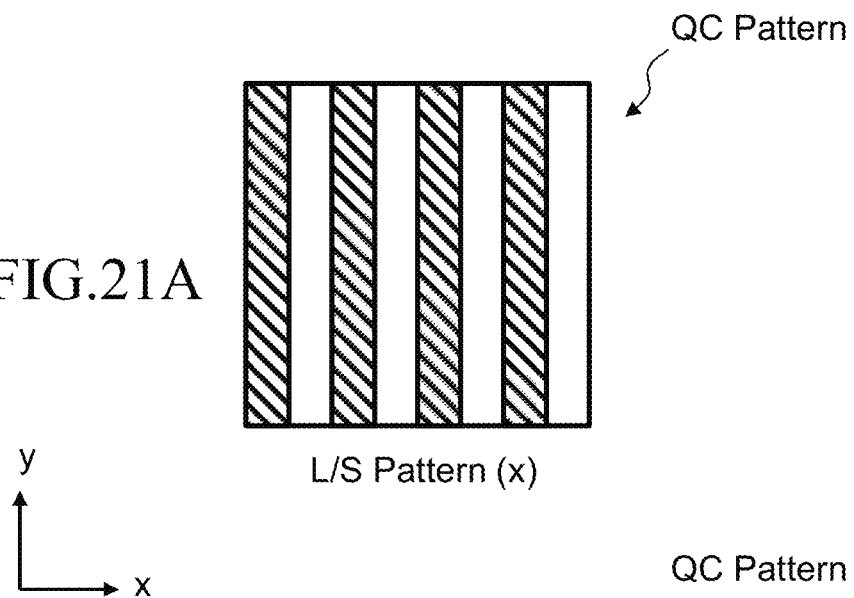
FIG.21A  L/S Pattern (x)
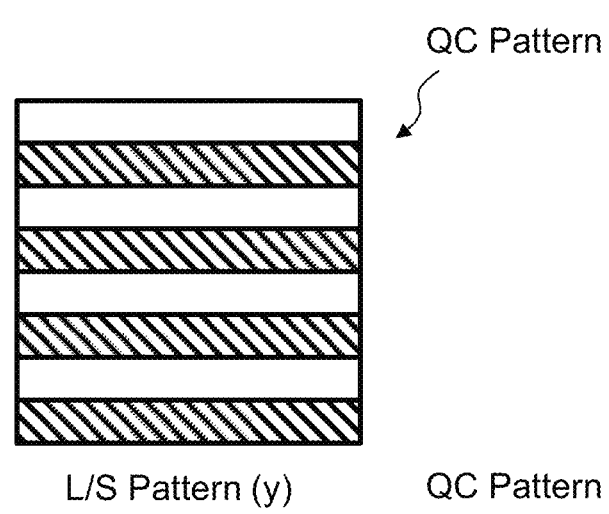
FIG.21B  L/S Pattern (y)
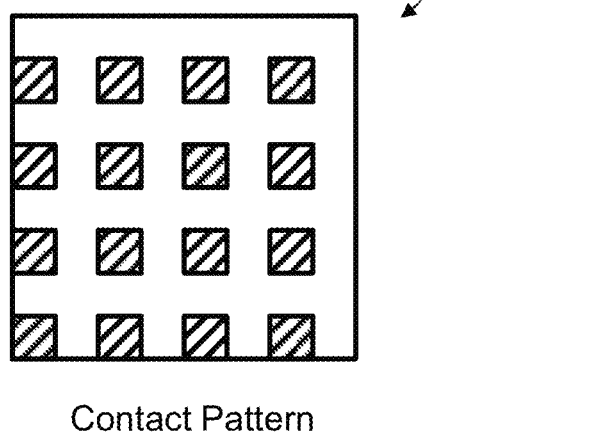
FIG.21C  Contact Pattern

(QC Layout Generation Screen)

(a) Global CD (LS Pattern)
- Global Arrangement Number: 3x3
- Arrangement Pitch: X | X2 | Y | Y2
- Dose: d2

(b) Local Position (Contact)
- Arrangement Coordinate: X | X3 | Y | Y3
- Dose: d3

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2017-138883 filed on Jul. 18, 2017 in Japan, the entire contents of which are incorporated herein by reference.

BACKGROUND OF THE INVENTION

Field of the Invention

Embodiments of the present invention relate to a charged particle beam writing apparatus and a charged particle beam writing method, and, for example, relate to a writing apparatus and method which automatically generates, within the apparatus, writing data of a pattern for checking/verifying the quality of a multi-beam writing apparatus.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" a mask pattern on a mask blank with electron beams.

For example, as a known example of employing the electron beam writing technique, there is a writing apparatus using multiple beams. Since it is possible for multi-beam writing to irradiate multiple beams at a time, the writing throughput can be greatly increased in comparison with single electron beam writing. For example, a writing apparatus employing the multi-beam system forms multiple beams by letting portions of an electron beam emitted from an electron gun individually pass through a corresponding one of a plurality of holes in a mask, performs blanking control for each beam, reduces each unblocked beam by an optical system in order to reduce a mask image, and deflects the beam by a deflector to irradiate a desired position on a target object or "sample".

An electron beam writing apparatus desirably needs to grasp (understand) change of the apparatus state during writing as much as possible because such a change affects writing quality. Specifically, it is necessary, based on results of actual writing processing, to grasp change which has been overlooked without being found by a calibration operation, etc. of the optical system, such as beam calibration. Therefore, conventionally, the user designs a QC (Quality check) pattern for checking the apparatus quality of the writing apparatus, to be in accordance with a pattern layout of a chip for actual semiconductor manufacturing, and then, data of the QC pattern and data of the chip pattern layout are together supplied to the writing apparatus, as writing data in the format to be input to the writing apparatus. Thereby, the writing apparatus inputs the writing data including the QC pattern which has been set outside in advance to be in accordance with the chip pattern layout to be written, and writes a pattern onto the substrate based on the writing data.

Although the term "checking the apparatus quality" is expressed in a single phrase, various layouts are used for the chip pattern layout required by the user. In many cases, an unspecified layout is used only once by the user. Therefore, with respect to such a chip pattern layout, if each time the user designs a QC pattern necessary for acquiring the apparatus quality to be evaluated, and embeds the designed QC pattern into the chip pattern layout, it causes a problem in that tremendous time and effort is needed before completing the embedding. Furthermore, it may occur that, when writing a QC pattern, a writing parameter different from that used in writing a chip pattern needs to be set for each mask and each evaluation item. In such a case, there is a problem of easily raising a setting mistake if the user each time examines a writing parameter for a mask or evaluation item.

Although not with respect to the embedding of a QC pattern, there is disclosed that writing data of a figure code such as a bar code pattern, which indicates writing information of a target object being written, is generated in the writing apparatus, and the generated data is combined with writing data of a chip pattern for manufacturing semiconductor, which is original to the mask, in order to write the figure code outside of the chip region (e.g., refer to Japanese Patent Application Laid-open No. 2009-253124).

BRIEF SUMMARY OF THE INVENTION

According to one aspect of the present invention, a charged particle beam writing apparatus includes:

a writing data generation circuitry configured to input one of character information and information of an item selected, for specifying an apparatus quality check pattern used for evaluating apparatus quality of a charged particle beam writing apparatus, and to generate writing data of the apparatus quality check pattern based on the one of the character information and the information of the item selected;

a combination circuitry configured to input writing data of an actual chip pattern to be written on a target object, and to combine the writing data of the actual chip pattern and the writing data of the apparatus quality check pattern such that the actual chip pattern and the apparatus quality check pattern do not overlap with each other; and a writing mechanism configured to include a stage on which the target object is placed, an emission source which emits a charged particle beam, and a deflector which deflects the charged particle beam, and to write the actual chip pattern and the apparatus quality check pattern on the target object, with the charged particle beam, based on combined writing data.

According to another aspect of the present invention, a charged particle beam writing method includes:

inputting one of character information and information of an item selected, for specifying an apparatus quality check pattern used for evaluating apparatus quality of a charged particle beam writing apparatus, and generating writing data of the apparatus quality check pattern based on the one of the character information and the information of the item selected;

inputting writing data of an actual chip pattern to be written on a target object, and combining the writing data of the actual chip pattern and the writing data of the apparatus quality check pattern such that the actual chip pattern and the apparatus quality check pattern do not overlap with each other; and writing the actual chip pattern and the apparatus quality check pattern on the target object, with a charged particle beam, based on combined writing data.

According to yet another aspect of the present invention, a charged particle beam writing apparatus includes:

a storage device configured to store a plurality of apparatus quality check pattern information files in each of which there is defined a different one from others among a plurality of pieces of character information for specifying a plurality of apparatus quality check patterns each used for evaluating apparatus quality of a charged particle beam writing apparatus;

an input circuitry configured to input identification information for identifying an arbitrary apparatus quality check pattern information file from the plurality of apparatus quality check pattern information files, and layout information for specifying an arrangement layout of an apparatus quality check pattern corresponding to the arbitrary apparatus quality check pattern information file;

an interpretation circuitry configured to interpret the character information and the layout information defined in the arbitrary apparatus quality check pattern information file;

a data generation circuitry configured to generate, based on interpreted results, writing data of the apparatus quality check pattern such that the apparatus quality check pattern is arranged according to the arrangement layout in a writing region for the actual chip pattern; and a writing mechanism configured to include a stage on which a target object is placed, an emission source which emits a charged particle beam, and a deflector which deflects the charged particle beam, and to write the apparatus quality check pattern in the writing region for the actual chip pattern on the target object, with the charged particle beam, based on the writing data, without writing the actual chip pattern.

BRIEF DESCRIPTION OF THE DRAWINGS

FIG. 10 shows an example of an input interface screen according to the first embodiment;

FIG. 11 shows an example of a QC information file according to the first embodiment;

FIGS. 14A to 14C show other examples of a QC pattern according to the first embodiment;

FIGS. 21A to 21C show other examples of a QC pattern according to the second embodiment;

DETAILED DESCRIPTION OF THE INVENTION

Embodiments below describe an apparatus and method which can automatically generate, within the writing apparatus, writing data of a pattern for checking the quality of the writing apparatus.

Embodiments below describe a configuration in which an electron beam is used as an example of a charged particle beam. The charged particle beam is not limited to the electron beam, and other charged particle beam such as an ion beam may also be used.

First Embodiment

Figure 1:
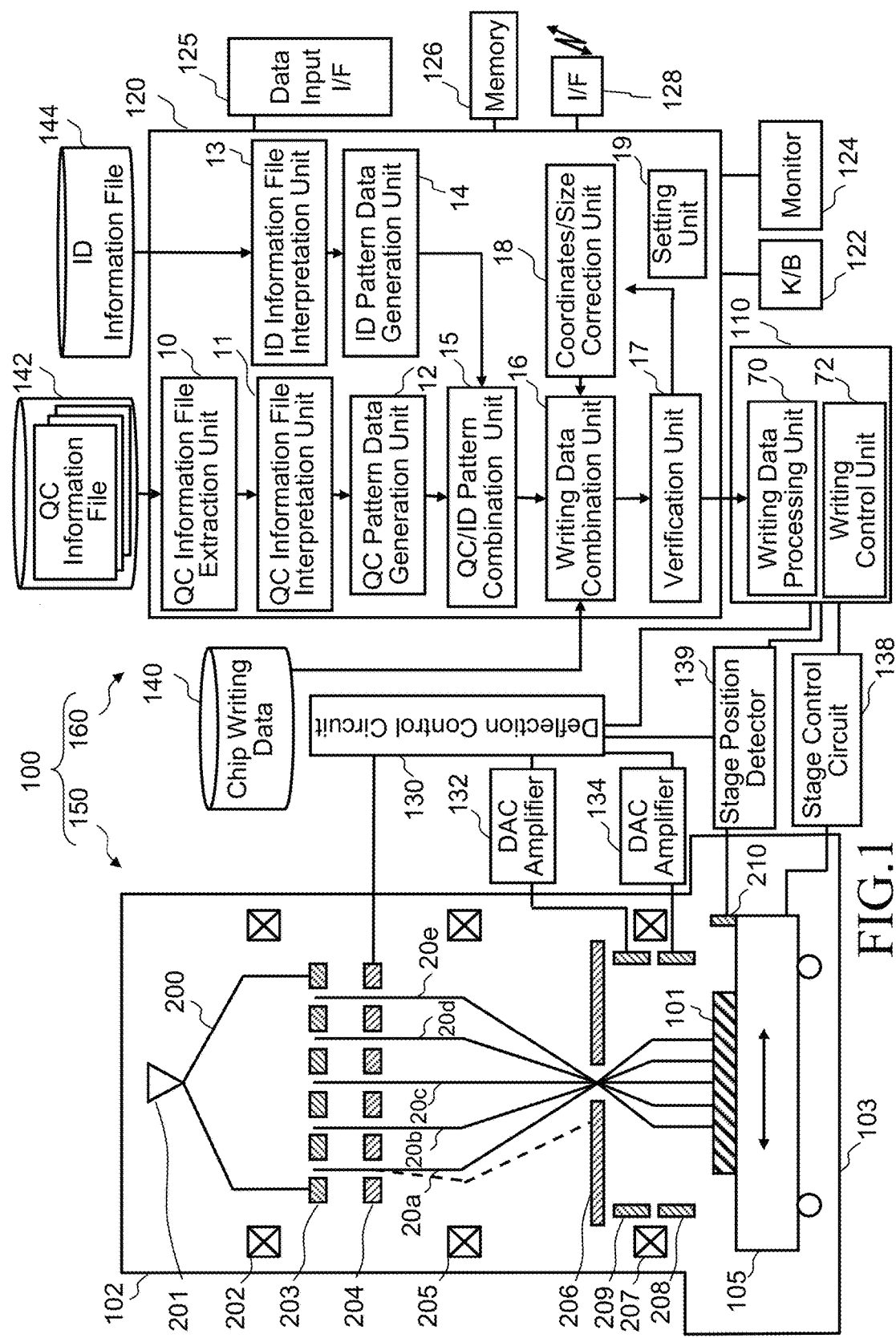
FIG. 1 is a schematic diagram showing a configuration of a writing according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multi charged particle beam writing apparatus. The writing mechanism 150 includes an electron optical column 102 (multi electron beam column) and a writing chamber 103. In the electron optical column 102, there are arranged an electron gun 201, an illumination lens 202, a shaping aperture array substrate 203, a blanking aperture array mechanism 204, a reducing lens 205, a limiting aperture substrate 206, an objective lens 207, a deflector 208, and a deflector 209. In the writing chamber 103, there is arranged an XY stage 105. On the XY stage 105, a target object or "sample" 101 such as a mask blank on which resist is applied, serving as a writing target substrate, is placed when writing is performed. The target object 101 is, for example, an exposure mask used for fabricating semiconductor devices, or a semiconductor substrate (silicon wafer) for fabricating semiconductor devices. Moreover, a mirror 210 for measuring the position of the XY stage 105 is arranged on the XY stage 105.

The control system circuit 160 includes control computers 110 and 120, a keyboard (K/B) 122, a monitor 124, a data input interface (I/F) circuit 125, a memory 126, an external interface (I/F) circuit 128, a deflection control circuit 130, digital-to-analog converting (DAC) amplifier units 132 and 134, a stage control circuit 138, a stage position detector 139, and storage devices 140, 142, and 144, such as magnetic disk drives. The control computers 110 and 120, the K/B 122, the monitor 124, the data input I/F circuit 125, the memory 126, the external I/F circuit 128, the deflection control circuit 130, the stage control circuit 138, the stage position detector 139, and the storage devices 140, 142, and 144 are connected with each other through a bus (not shown).

The deflection control circuit 130 is connected to the DAC amplifier units 132 and 134, and a blanking aperture array mechanism 204. Outputs of the DAC amplifier unit 132 are connected to the deflector 209. Outputs of the DAC amplifier unit 134 are connected to the deflector 208. The stage position detector 139 irradiates the mirror 210 on the XY stage 105 with a laser beam, and receives a reflected light from the mirror 210. Then, the stage position detector 139 measures the position of the XY stage 105 by using the principle of the laser interference based on information on the reflected light. The measured position information is output to the control computer 110 and the deflection control circuit 130.

In the control computer 110, there are arranged a writing data processing unit 70 and a writing control unit 72. Each of " . . . units" such as the writing data processing unit 70 and the writing control unit 72 includes a processing circuitry. As the processing circuitry, for example, an electric circuit, computer, processor, circuit board, quantum circuit, or semiconductor device is used. Each " . . . unit" may use a common processing circuitry (same processing circuitry), or different processing circuitries (separate processing circuitries). Information input and output to/from the writing data processing unit 70 and the writing control unit 72, and information being operated are stored in a memory (not shown) each time.

In the control computer 120, there are arranged a QC (Quality Check) information file extraction unit 10, a QC information file interpretation unit 11, a QC pattern data generation unit 12, an ID information file interpretation unit 13, an ID pattern data generation unit 14, a QC/ID pattern combination unit 15, a writing data combination unit 16, a verification unit 17, a coordinate/size correction unit 18, and a setting unit 19. Each of " . . . units" such as the QC (Quality Check) information file extraction unit 10, the QC information file interpretation unit 11, the QC pattern data generation unit 12, the ID information file interpretation unit 13, the ID pattern data generation unit 14, the QC/ID pattern combination unit 15, the writing data combination unit 16, the verification unit 17, the coordinate/size correction unit 18, and the setting unit 19 includes a processing circuitry. As the processing circuitry, for example, an electric circuit, computer, processor, circuit board, quantum circuit, or semiconductor device is used. Each " . . . unit" may use a common processing circuitry (same processing circuitry), or different processing circuitries (separate processing circuitries). Information input and output to/from the QC (Quality Check) information file extraction unit 10, the QC information file interpretation unit 11, the QC pattern data generation unit 12, the ID information file interpretation unit 13, the ID pattern data generation unit 14, the QC/ID pattern combination unit 15, the writing data combination unit 16, the verification unit 17, the coordinate/size correction unit 18, and the setting unit 19, and information being operated are stored in the memory 126 each time.

When performing electron beam writing, first, layout of a semiconductor integrated circuit is designed, and layout data (design data), in which pattern layout for one chip is defined, is generated. Then, the layout data is converted in an external conversion device so as to generate writing data of a chip pattern, (that is, chip writing data), which can be input into the writing apparatus 100. The chip writing data usually defines information on a plurality of figure patterns configuring the chip concerned. Specifically, it defines a figure code, coordinates of each apex (vertex), etc. for each figure pattern. The chip writing data for writing a predetermined pattern onto the target object is input from the outside of the writing apparatus 100 through the external I/F circuit 128, and stored in the magnetic disk drive 140.

In performing writing processing, an ID information file is created in which identification information for identifying a target object (mask) to be written this time is defined as character information (ID character information). The ID information file is input from the outside of the writing apparatus 100 through the external I/F circuit 128, and stored in the magnetic disk drive 144. Alternatively, the operator may input file contents through the K/B 122 used as an input means, and then the created file may be stored in the magnetic disk drive 144. Since the contents of the ID information file can be displayed on the monitor 124, the operator is able to input, delete, or correct the information through the K/B 122 used as an input means. It is preferable that information (size, position) of a chip frame of a chip pattern written based on chip writing data is also defined in the ID information file.

Moreover, as will be described later, a plurality of QC information files are input from the outside of the writing apparatus 100 through the external I/F circuit 128, and stored in the magnetic disk drive 142, for example.

FIG. 1 shows configuration elements necessary for describing the first embodiment. It should be understood that other configuration elements generally necessary for the writing apparatus 100 may also be included therein.

Figure 2:
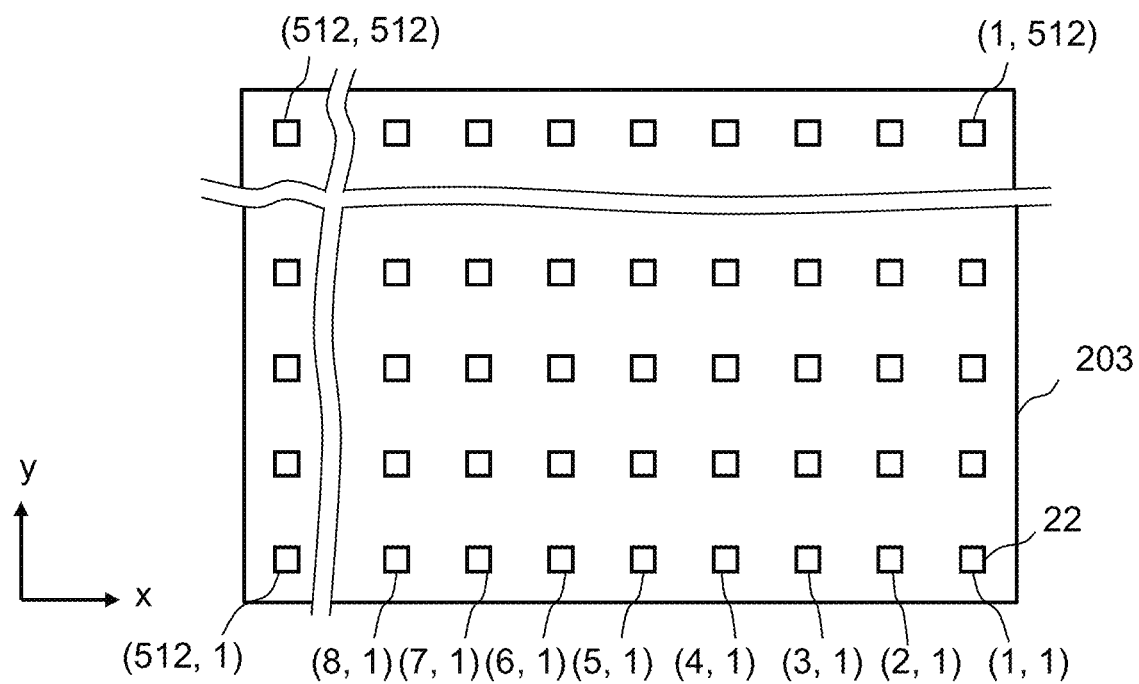
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings, apertures) 22 of p rows long (length in the y direction) and q columns wide (width in x direction) (p≥2, q≥2) are formed, like a matrix, at a predetermined arrangement pitch in the shaping aperture array substrate 203. In FIG. 2, for example, holes 22 of 512 (rows of holes arrayed in y direction)×512 (columns of holes arrayed in x direction) are formed. Each of the holes 22 is a quadrangle (rectangle) having the same dimension and shape. Alternatively, each of the holes 22 may be a circle with the same diameter. By making portions of an electron beam 200 individually pass through a corresponding hole of a plurality of holes 22, multiple beams 20 are formed where each beam is in a desired shape. The method of arranging the holes 22 is not limited to the case of FIG. 2 where holes are arranged in a grid form in the length and width directions. For example, with respect to the kth and the (k+1)th rows which are arrayed (accumulated) in the length direction (y direction), each hole in the kth row and each hole in the (k+1)th row may be mutually displaced in the width direction (x direction) by a dimension "a". Similarly, with respect to the (k+1)th and the (k+2)th rows which are arrayed (accumulated) in the length direction (y direction), each hole in the (k+1)th row and each hole in the (k+2)th row may be mutually displaced in the width direction (x direction) by a dimension "b", for example.

Figure 3:
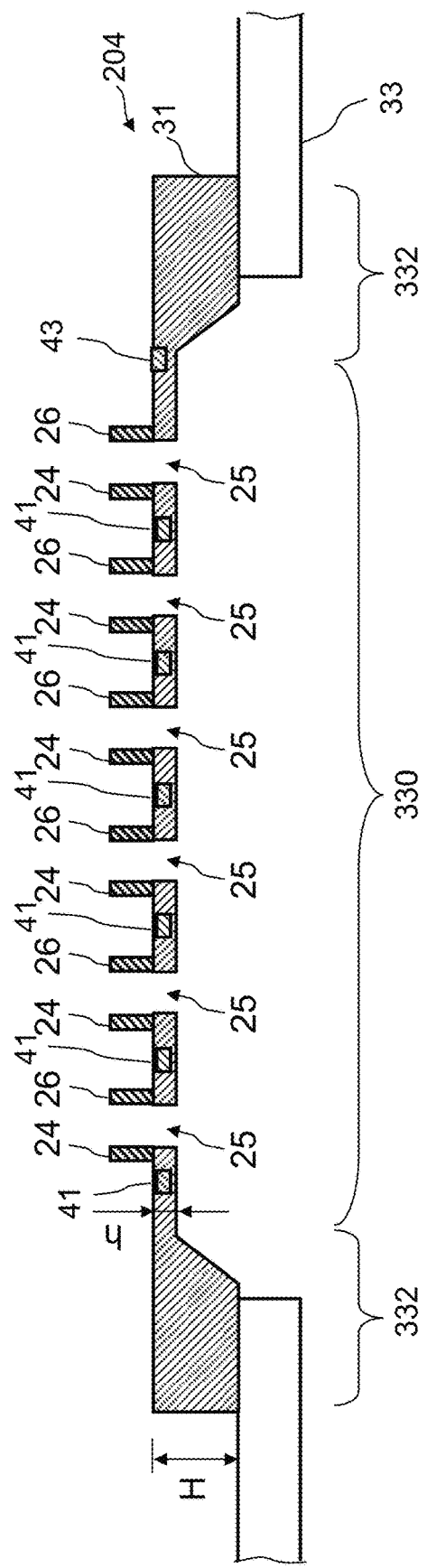
FIG. 3 is a sectional view showing a configuration of a blanking aperture array mechanism according to the first embodiment.

FIG. 3 is a sectional view showing a configuration of a blanking aperture array mechanism according to the first embodiment.

Figure 4:
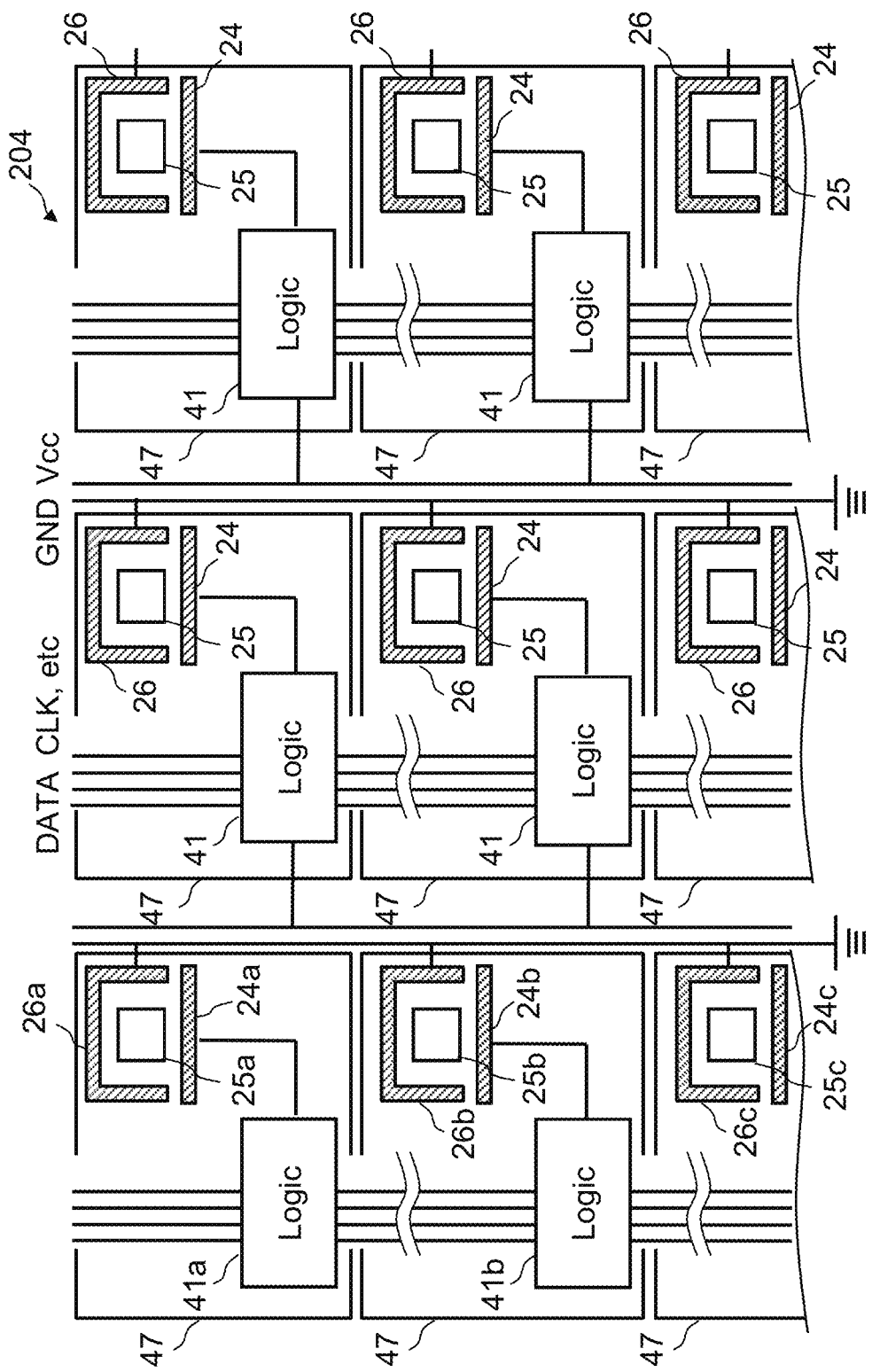
FIG. 4 is a top view conceptual diagram showing a portion of the structure in a membrane region of a blanking aperture array mechanism according to the first embodiment.

FIG. 4 is a top view conceptual diagram showing a portion of the structure in a membrane region of a blanking aperture array mechanism according to the first embodiment. The position relation of a control electrode 24, a counter electrode 26, a control circuit 41, and a pad 43 in FIG. 3 is not in accordance with that of FIG. 4. With regard to the structure of the blanking aperture array mechanism 204, a semiconductor substrate 31 made of silicon, etc. is placed on a support table 33. The central part of the substrate 31 is shaved from the back side, and made into a membrane region 330 (first region) having a thin film thickness h. The circumference surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the backside of the outer peripheral region 332, the substrate 31 is supported on the support table 33. The central part of the support table 33 is open, and the membrane region 330 is located at this opening region.

In the membrane region 330 of the substrate 31 of the blanking aperture array mechanism 204, passage holes 25 (openings) through each of which a corresponding one of multiple beams passes are formed at positions each corresponding to each hole 22 of the shaping aperture array substrate 203 shown in FIG. 2. In other words, in the membrane region 330 of the substrate 31, there are formed a plurality of passage holes 25 in an array through each of which a corresponding beam of electron multiple beams passes. Moreover, in the membrane region 330 of the substrate 31, there are arranged a plurality of electrode pairs each composed of two electrodes being opposite to each other with respect to a corresponding one of a plurality of passage holes 25. Specifically, in the membrane region 330, as shown in FIGS. 3 and 4, each pair (blanker: blanking deflector) of the control electrode 24 and the counter electrode 26 for blanking deflection is arranged close to a corresponding passage hole 25 in a manner such that the electrodes 24 and 26 are opposite to each other across the passage hole 25 concerned. Moreover, close to each passage hole 25 in the membrane region 330 of the substrate 31, there is arranged the control circuit 41 (logic circuit) for applying a deflection voltage to the control electrode 24 for the passage hole 25 concerned. The counter electrode 26 for each beam is grounded (earthed).

As shown in FIG. 4, n-bit (e.g., 10-bit) parallel lines for control signals are connected to each control circuit 41. In addition to the n-bit parallel lines for controlling signals, lines for a clock signal, a read signal, a shot signal, a power supply, and the like are connected to each control circuit 41. Alternatively, apart of the parallel lines may be used as the lines for a clock signal, a read signal, a shot signal, a power supply, and the like. An individual blanking mechanism 47 composed of the control electrode 24, the counter electrode 26, and the control circuit 41 is configured for each of the multiple beams. In the example of FIG. 3, the control electrode 24, the counter electrode 26, and the control circuit 41 are arranged in the membrane region 330 having a thin film thickness of the substrate 31. However, it is not limited thereto. A plurality of control circuits 41 formed in an array in the membrane region 330 are grouped, for example, per row or per column, and the control circuits 41 in each group are connected in series as shown in FIG. 4. Then, the pad 43 arranged for each group sends a signal to the control circuits 41 in the group concerned. Specifically, a shift register (not shown) is arranged in each control circuit 41, and for example, shift registers in the control circuits 41 for beams in the same row in p×q multiple beams, for example, are connected in series. For example, control signals for beams in the same row in the p×q multiple beams are transmitted in series, and, for example, a control signal for each beam is stored in a corresponding control circuit 41 by p clock signals totally.

Figure 5:
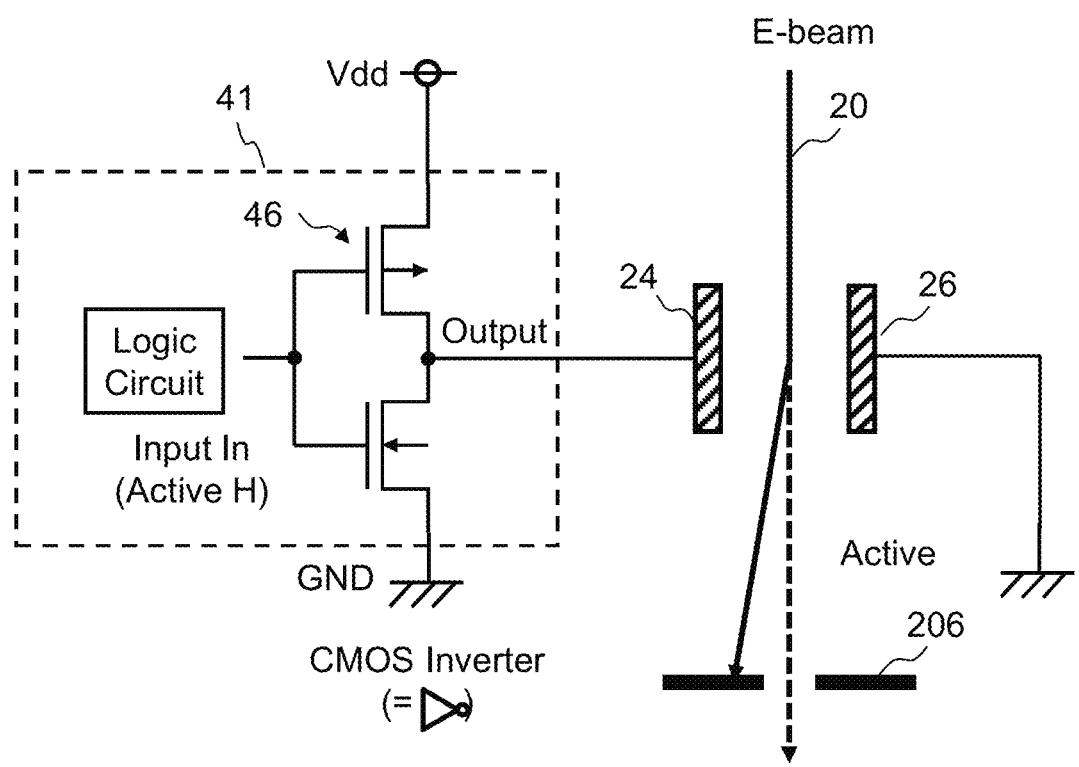
FIG. 5 shows an example of an individual blanking mechanism according to the first embodiment.

FIG. 5 shows an example of an individual blanking mechanism according to the first embodiment. As shown in FIG. 5, an amplifier 46 (an example of a switching circuit) is arranged in the control circuit 41. In the case of FIG. 5, a CMOS (complementary MOS) inverter circuit is arranged as an example of the amplifier 46. The CMOS inverter circuit is connected to a positive potential (Vdd: blanking electric potential: first electric potential) (e.g., 5 V) (first electric potential) and to a ground potential (GND: second electric potential). The output line (OUT) of the CMOS inverter circuit is connected to the control electrode 24. On the other hand, the counter electrode 26 is applied with a ground electric potential. A plurality of control electrodes 24, each of which is applied with a blanking electric potential and a ground electric potential in a switchable manner, are arranged on the substrate 31 such that each control electrode 24 and the corresponding counter electrode 26 are opposite to each other with respect to a corresponding one of a plurality of passage holes 25.

As an input (IN) of each CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in a state where an L electric potential is applied to the input (IN) of the CMOS inverter circuit, the output (OUT) of the CMOS inverter circuit becomes a positive potential (Vdd), and then, a corresponding beam 20 is deflected by an electric field due to a potential difference from the ground potential of the counter electrode 26 so as to be blocked by the limiting aperture substrate 206, thereby being controlled to be in a beam OFF condition. On the other hand, in a state (active state) where an H electric potential is applied to the input (IN) of the CMOS inverter circuit, the output (OUT) of the CMOS inverter circuit becomes a ground potential, and therefore, since there is no potential difference from the ground potential of the counter electrode 26, a corresponding beam 20 is not deflected, thereby being controlled to be in a beam ON condition by making the beam concerned pass through the limiting aperture substrate 206.

The electron beam 20 passing through a corresponding passage hole is deflected by a voltage independently applied to a pair of the control electrode 24 and the counter electrode 26. Blanking control is performed by this deflection. Specifically, a pair of the control electrode 24 and the counter electrode 26 individually provides blanking deflection of a corresponding beam of multiple beams by an electric potential switchable by the CMOS inverter circuit which serves as a corresponding switching circuit. Thus, each of a plurality of blankers performs blanking deflection of a corresponding beam in the multiple beams having passed through a plurality of holes 22 (openings) in the shaping aperture array substrate 203.

Figure 6:
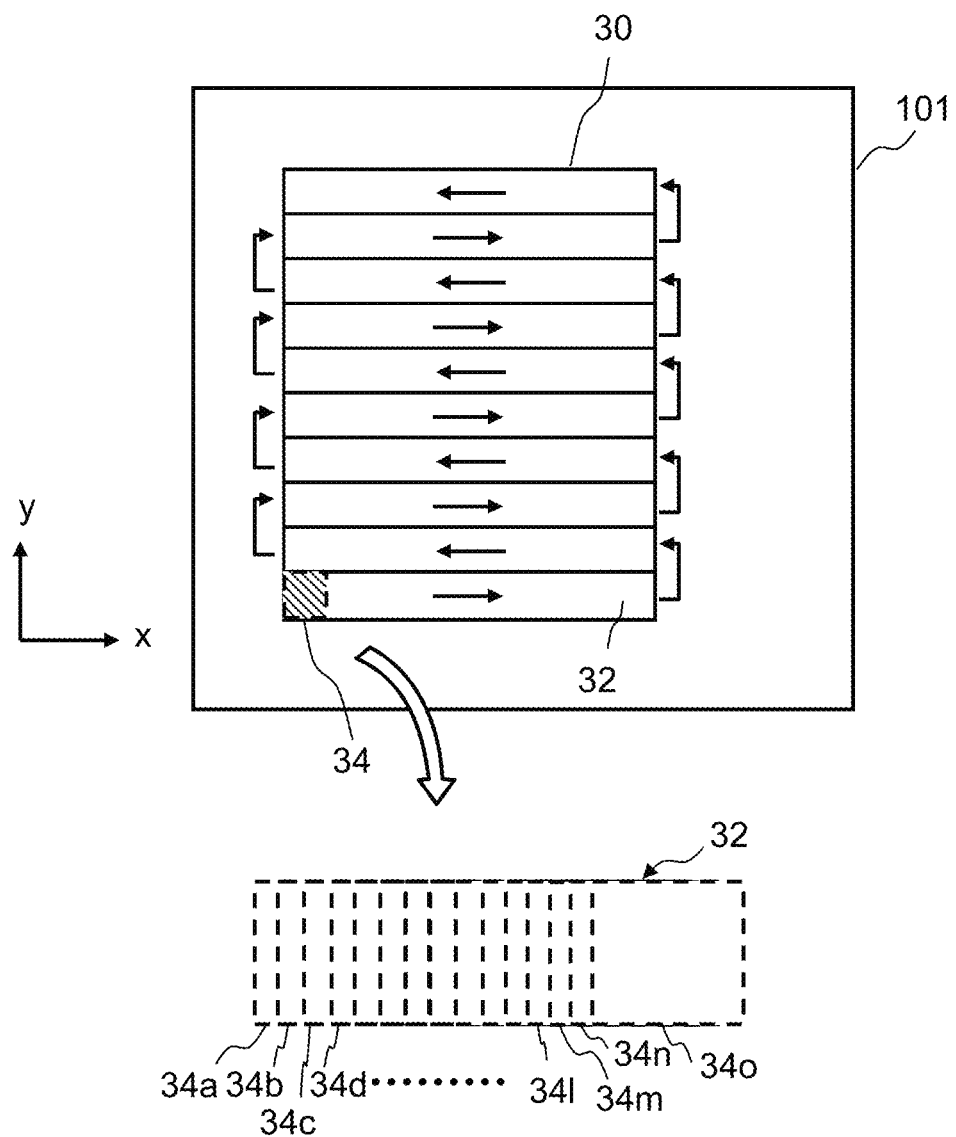
FIG. 6 is a conceptual diagram explaining an example of a writing operation according to the first embodiment.

FIG. 6 is a conceptual diagram explaining an example of a writing operation according to the first embodiment. As shown in FIG. 6, a chip writing region 30 (writing region) of the target object 101 is virtually divided by a predetermined width in the y direction into a plurality of stripe regions 32 in a strip form, for example. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the −x direction, so that the writing advances relatively in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end and located relatively in the y direction. Then, by moving the XY stage 105 in the x direction, for example, writing advances in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns up to as many as the number of the holes 22 are formed at a time by one shot of multiple beams having been formed by passing through the holes 22 in the shaping aperture array substrate 203.

Figure 7:
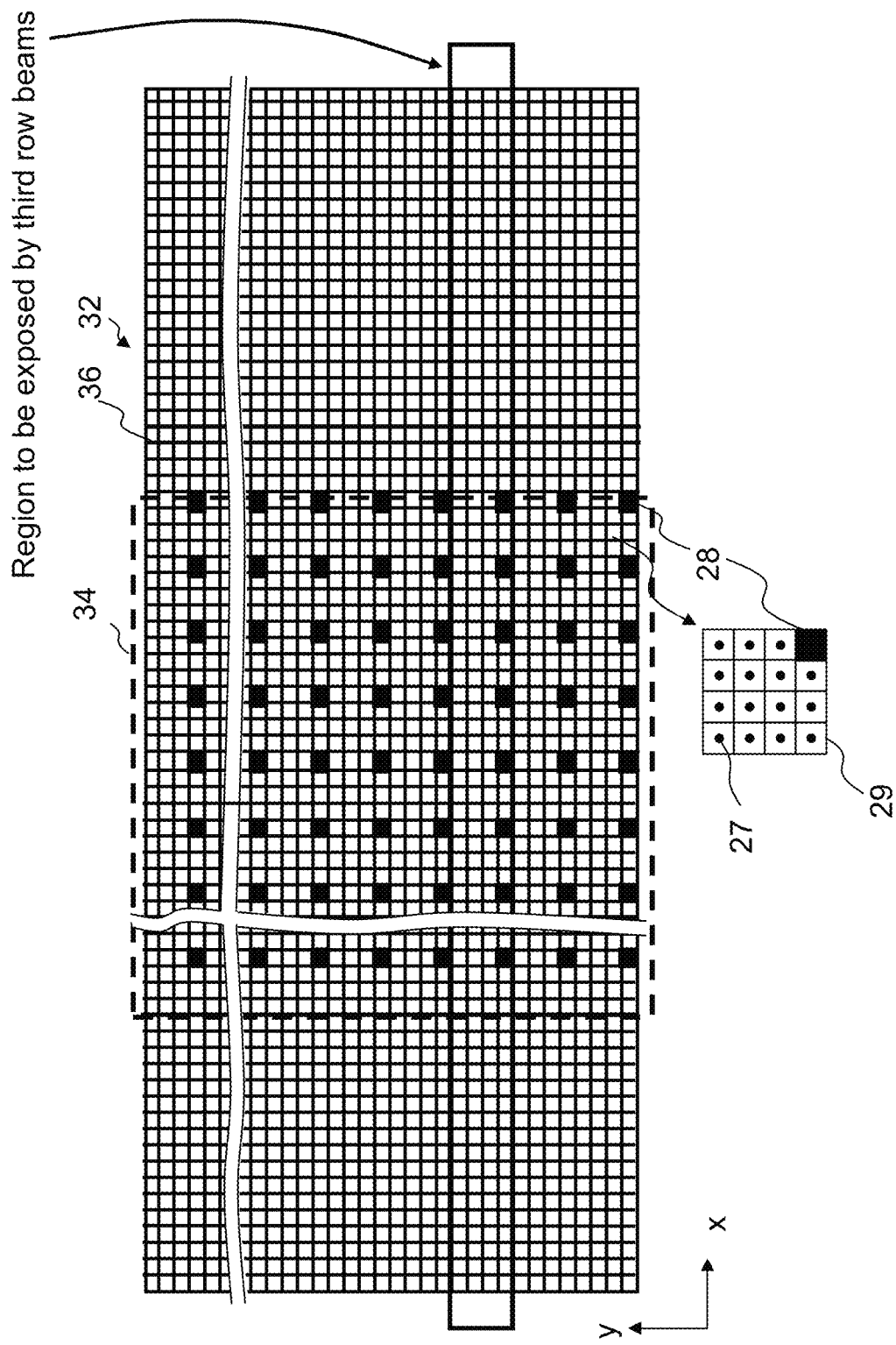
FIG. 7 shows an example of an irradiation region of multiple beams and a pixel to be written according to the first embodiment.

FIG. 7 shows an example of an irradiation region of multiple beams and a pixel to be written (writing target pixel) according to the first embodiment. In FIG. 7, in the stripe region 32, there are set a plurality of control grids 27 (design grids) arranged in a grid form at the beam size pitch of the multiple beams 20 on the surface of the target object 101, for example. Preferably, they are arranged at an arrangement pitch of around 10 nm. A plurality of control grids 27 serve as design irradiation positions of the multiple beams 20. The arrangement pitch of the control grid 27 is not limited to the beam size, and may be an arbitrary size which can be controlled as a deflecting position of the deflector 209, regardless of the beam size. Then, a plurality of pixels 36 obtained by virtually dividing into a mesh form by the same size as that of the arrangement pitch of the control grid 27 are set, each of which is centering on each control grid 27. Each pixel 36 serves as an irradiation unit region per beam of multiple beams. FIG. 7 shows the case where the writing region of the target object 101 is divided, for example, in the y direction, into a plurality of stripe regions 32 by the width size being substantially the same as the size of the irradiation region 34 (writing field) which can be irradiated with one irradiation of the multiple beams 20. The size in the x direction of the irradiation region 34 can be defined by the value obtained by multiplying the pitch between beams in the x direction of the multiple beams 20 by the number of beams in the x direction. The size in the y direction of the irradiation region 34 can be defined by the value obtained by multiplying the pitch between beams in the y direction of the multiple beams 20 by the number of beams in the y direction. The width of the stripe region 32 is not limited to this. Preferably, the width of the stripe region 32 is n times (n being an integer of 1 or more) the size of the irradiation region 34. FIG. 7 shows the case of multiple beams of 512×512 (rows×columns) being simplified to 8×8 (rows×columns). In the irradiation region 34, there are shown a plurality of pixels 28 (beam writing positions) which can be irradiated with one shot of the multiple beams 20. In other words, the pitch between adjacent pixels 28 is the pitch between beams of the design multiple beams. In the example of FIG. 7, one sub-irradiation region 29 is a square region surrounded by four adjacent pixels 28 at four corners and including one of the four pixels 28. In the case of FIG. 7, each sub-irradiation region 29 is composed of 4×4 pixels.

Figure 8:
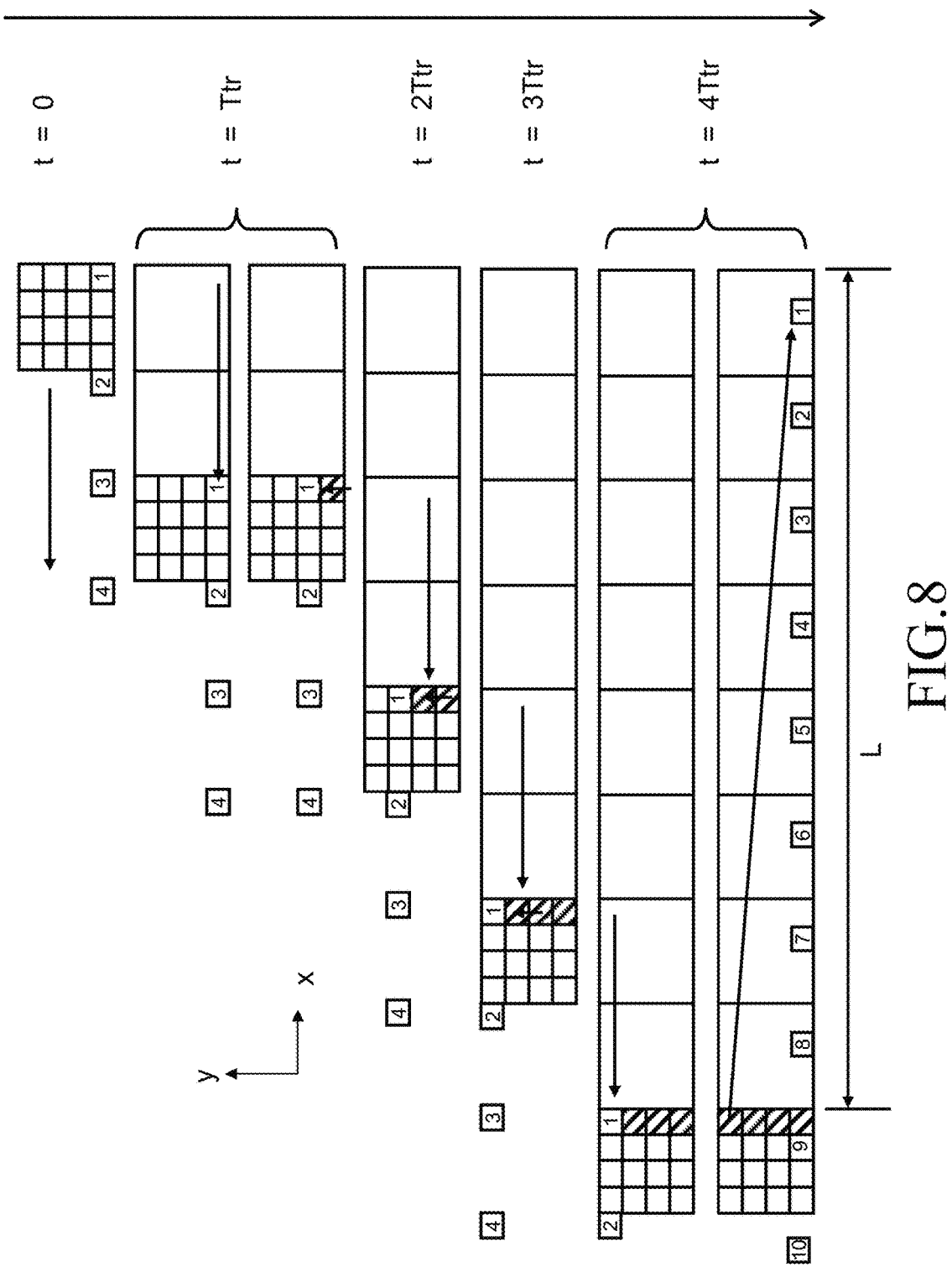
FIG. 8 illustrates an example of a writing method of multiple beams according to the first embodiment.

FIG. 8 illustrates an example of a writing method of multiple beams according to the first embodiment. FIG. 8 shows a part of the sub-irradiation region 29 to be written by respective beams at the coordinates (1, 3), (2, 3), (3, 3), . . . , (512, 3) in the third row from the bottom in the multiple beams for writing the stripe region 32 shown in FIG. 7. In the example of FIG. 8, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collectively deflecting the entire multiple beams 20 by the deflector 208. In other words, tracking control is performed. In the example of FIG. 8, one tracking cycle is executed by writing (exposing) four pixels while moving the distance of eight beam pitches.

Specifically, the stage position measuring instrument 139 measures the position of the XY stage 105 by irradiating the mirror 210 with a laser and receiving a reflected light from the mirror 210. The measured position of the XY stage 105 is output to the control computer 110. In the control computer 110, the writing control unit 72 outputs the position information on the XY stage 105 to the deflection control circuit 130. In accordance with the movement of the XY stage 105, the deflection control circuit 130 calculates deflection amount data (tracking deflection data) for deflecting beams to follow the movement of the XY stage 105. The tracking deflection data being a digital signal is output to the DAC amplifier 134. The DAC amplifier 134 converts the digital signal to an analog signal and amplifies it to be applied as a tracking deflection voltage to the main deflector 208.

The writing mechanism 150 irradiates each control grid 27 with a corresponding beam in an ON state in the multiple beams 20 during a writing time (irradiation time or exposure time) corresponding to each control grid 27 within a maximum irradiation time Ttr of the irradiation time of each of the multiple beams of the shot concerned.

In the example of FIG. 8, the control grid 27 of the first pixel 36 from the right in the bottom row of the sub-irradiation region 29 concerned is irradiated with the first shot of the beam (1) at coordinates (1, 3) during the time from t=0 to t=maximum irradiation time Ttr, for example. Thereby, the pixel concerned has received beam irradiation of a desired irradiation time. The XY stage 105 moves two beam pitches in the −x direction during the time from t=0 to t=Ttr, for example. During this time period, the tracking operation is continuously performed.

After the maximum irradiation time Ttr of the shot concerned has passed since the start of beam irradiation of the shot concerned, while the beam deflection for tracking control is continuously performed by the deflector 208, the writing position (previous writing position) of each beam is shifted to a next writing position (current writing position) of each beam by collectively deflecting the multiple beams 20 by the deflector 209, which is performed in addition to the beam deflection for tracking control. In the example of FIG. 8, when the time becomes t=Ttr, the writing target control grid 27 to be written is shifted from the control grid 27 of the first pixel 36 from the right in the bottom row of the sub-irradiation region 29 concerned to the control grid 27 of the first pixel 36 from the right in the second row from the bottom. Since the XY stage 105 is moving at a fixed speed also during this time period, the tracking operation is continuously performed.

Then, while the tracking control is continuously performed, respective corresponding beams in the ON state in the multiple beams 20 are applied to the shifted writing positions corresponding to the respective beams during a writing time corresponding to each of the respective beams within the maximum irradiation time Ttr of the shot concerned. In the example of FIG. 8, the control grid 27 of the first pixel 36 from the right in the second row from the bottom of the sub-irradiation region 29 concerned is irradiated with the second shot of the beam (1) at the coordinates (1, 3) during the time from t=Ttr to t=2Ttr, for example. The XY stage 105 moves two beam pitches in the −x direction during the time from t=Ttr to t=2Ttr, for example. During this time period, the tracking operation is continuously performed.

In the example of FIG. 8, when the time becomes t=2Ttr, the writing target control grid 27 to be written is shifted from the control grid 27 of the first pixel 36 from the right in the second row from the bottom of the sub-irradiation region 29 concerned to the control grid 27 of the first pixel 36 from the right in the third row from the bottom. Since the XY stage 105 is moving also during this time period, the tracking operation is continuously performed. Then, the control grid 27 of the first pixel 36 from the right in the third row from the bottom of the sub-irradiation region 29 concerned is irradiated with a beam of the third shot of the beam (1) at the coordinates (1, 3) during the time from t=2Ttr to t=3Ttr, for example. Thereby, the control grid 27 of the pixel 36 concerned has received beam irradiation of a desired irradiation time.

The XY stage 105 moves two beam pitches in the −x direction during the time from t=2Ttr to t=3Ttr, for example. During this time period, the tracking operation is continuously performed. When the time becomes t=3Ttr, the writing target grid 27 to be written is shifted from the control grid 27 of the first pixel 36 from the right in the third row from the bottom of the sub-irradiation region 29 concerned to the control grid 27 of the first pixel 36 from the right in the fourth row from the bottom by collectively deflecting the multiple beams by the deflector 209. Since the XY stage 105 is moving also during this time period, the tracking operation is continuously performed.

The control grid 27 of the first pixel 36 from the right in the fourth row from the bottom of the sub-irradiation region 29 concerned is irradiated with a beam of the fourth shot of the beam (1) at the coordinates (1, 3) during the time from t=3Ttr to t=4Ttr, for example. Thereby, the control grid 27 of the pixel 36 concerned has received beam irradiation of a desired irradiation time.

The XY stage 105 moves two beam pitches in the −x direction during the time from t=3Ttr to t=4Ttr, for example. During this time period, the tracking operation is continuously performed. In this manner, writing of the pixels in the first column from the right of the sub-irradiation region 29 concerned has been completed.

In the example of FIG. 8, after applying a corresponding beam to the writing position of each beam which has been shifted three times from the initial position, the DAC amplifier unit 134 returns the tracking position to the start position of tracking where the tracking control was started, by resetting the beam deflection for tracking control. In other words, the tracking position is returned in the opposite direction to the direction of the stage movement. In the example of FIG. 8, when the time becomes t=4Ttr, tracking of the sub-irradiation region 29 concerned is cancelled, and the beam is swung back to a new sub-irradiation region 29 which has been shifted by eight beam pitches in the x direction. Although the beam (1) at the coordinates (1, 3) has been described in the example of FIG. 8, writing is also similarly performed for each sub-irradiation region 29 corresponding to a beam at other coordinates. That is, the beam at coordinates (n, m) completes writing of pixels in the first column from the right of a corresponding sub-irradiation region 29 when the time becomes t=4Ttr. For example, the beam (2) at coordinates (2, 3) completes writing of pixels in the first column from the right of the sub-irradiation region 29 adjacent in the −x direction to the sub-irradiation region 29 for the beam (1) of FIG. 8.

Since writing of the pixels in the first column from the right of each sub-irradiation region 29 has been completed, in a next tracking cycle after resetting the tracking, the deflector 209 performs deflection such that the writing position of each corresponding beam is adjusted (shifted) to the second pixel from the right in the first row from the bottom of each sub-irradiation region 29.

As described above, each shot is performed while shifting one control grid 27 (pixel 36) by one control grid 27 (pixel 36) by the deflector 209, in a state where the relative position of the irradiation region 34 to the target object 101 is controlled by the deflector 208 to be unchanged position during the same tracking cycle. Then, after finishing one tracking cycle and returning the tracking position of the irradiation region 34, as shown in the lower part of FIG. 6, the shot position for the first shot is adjusted to the position shifted by one control grid (one pixel), for example, and each shot is performed shifting one control grid (one pixel) by one control grid (one pixel) by the deflector 209 while performing a next tracking control. By repeating this operation during writing the stripe region 32, the position of the irradiation region 34 is shifted one by one, such as from 34a to 34o, to perform writing of the stripe region concerned.

When writing the target object 101 with the multiple beams 20, as described above, irradiation is performed per control grid (one pixel) sequentially and continuously with multiple beams 20, serving as shot beams, by moving the beam deflection position by the deflector 209 while following the movement of the XY stage 105 during the tracking operation by the deflector 208. It is determined, based on the writing sequence, which beam of multiple beams irradiates which control grid 27 (pixel 36) on the target object 101. Then, the region obtained by multiplying the beam pitch (x direction) by the beam pitch (y direction), where the beam pitch is between beams adjacent in the x or y direction of multiple beams on the surface of the target object 101, is configured by a region (sub-irradiation region 29) composed of n×n pixels. For example, when the XY stage 105 moves in the −x direction by eight beam pitches (x direction) by one tracking operation, as described above, n control grids (n pixels) are written in the y direction by one beam while the irradiation position is shifted. Alternatively, n control grids (n pixels) may be written in the x direction or diagonal direction by one beam while the irradiation position is shifted. Then, by the next tracking operation, other n pixels in the same n×n pixel region are similarly written by a different beam from the one used above. Thus, n pixels are written each time of n times of tracking operations, using a different beam each time, thereby writing all the pixels in one region of n×n pixels. With respect also to other regions each composed of n×n pixels in the irradiation region of multiple beams, the same operation is executed at the same time so as to perform writing similarly.

Next, operations of the writing mechanism 150 of the writing apparatus 100 will be described. The electron beam 200 emitted from the electron gun 201 (emission source)

almost perpendicularly (e.g., vertically) illuminates the whole of the shaping aperture array substrate 203 by the illumination lens 202. A plurality of quadrangular holes (openings) are formed in the shaping aperture array substrate 203. The region including all the plurality of holes is irradiated with the electron beam 200. For example, a plurality of quadrangular electron beams (multiple beams) 20a to 20e are formed by letting portions of the electron beam 200, which irradiates the positions of a plurality of holes, individually pass through a corresponding hole of the plurality of holes of the shaping aperture array substrate 203. The multiple beams 20a to 20e individually pass through corresponding blankers (first deflector: individual blanking mechanism) of the blanking aperture array mechanism 204. Each blanker deflects (provides blanking deflection) the electron beam 20 which is individually passing.

The multiple beams 20a to 20e having passed through the blanking aperture array mechanism 204 are reduced by the reducing lens 205, and go toward the hole in the center of the limiting aperture substrate 206. At this stage, the electron beam 20a which was deflected by the blanker of the blanking aperture array mechanism 204 deviates (shifts) from the hole in the center of the limiting aperture substrate 206 and is blocked by the limiting aperture substrate 206. On the other hand, the electron beams 20b to 20e which were not deflected by the blanker of the blanking aperture array mechanism 204 pass through the hole in the center of the limiting aperture substrate 206 as shown in FIG. 1. Blanking control is provided by ON/OFF of the individual blanking mechanism so as to control ON/OFF of beams. Thus, the limiting aperture substrate 206 blocks each beam which was deflected to be in the OFF state by the individual blanking mechanism 47. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, respective beams (the whole of the multiple beams 20) having passed through the limiting aperture substrate 206 are collectively deflected in the same direction by the deflectors 208 and 209 in order to irradiate respective beam irradiation positions on the target object 101. Ideally, the multiple beams 20 irradiating at a time are aligned at pitches obtained by multiplying the arrangement pitch of a plurality of holes of the shaping aperture array substrate 203 by a desired reduction ratio described above.

The writing apparatus 100 desirably needs to grasp (understand) change of the apparatus state during writing as much as possible because such a change affects writing quality. Specifically, it is necessary, based on results of actual writing processing, to grasp change which has been overlooked without being found by a calibration operation, etc. of the optical system, such as beam calibration. Therefore, as described above, conventionally, the user designs a QC (Quality check) pattern (apparatus quality check pattern) for evaluating or "checking" the apparatus quality of the writing apparatus 100, to be in accordance with a pattern layout of a chip for actual semiconductor manufacturing. Moreover, when writing a QC pattern, it may occur that a writing parameter different from that used in writing a chip pattern needs to be set for each resist type to be used and for each evaluation item. Then, according to the first embodiment, for each QC pattern type and for each resist type to be used and evaluation item, a QC information file is created in which a QC pattern type, an arrangement layout, writing conditions, etc. are defined as character information. Then, a plurality of QC information files on the supposition of various conditions are beforehand input from the outside of the writing apparatus 100 through the external I/F circuit 128, and stored in the magnetic disk drive 142. Alternatively, the operator may input file contents through the K/B 122, etc. used as an input means, and then the created file may be stored in the magnetic disk drive 142. The magnetic disk drive 142 stores a plurality of apparatus quality check pattern information files in each of which there is defined a different one from others among a plurality of pieces of character information for specifying a plurality of apparatus quality check patterns each used for evaluating the apparatus quality of the writing apparatus 100. In other words, a plurality of QC information files are registered to the writing apparatus 100, and database of the QC information files is built in advance. Since the contents of the QC information file can be displayed in the data input I/F circuit 125 and/or on the monitor 124, the operator is able to input, delete, or correct the information through the data input I/F circuit 125 and/or the K/B 122 used as an input means. It is preferable to use, as the data input I/F circuit 125, a graphical user interface (GUI), a touch panel, etc., for example. Therefore, the user arbitrarily selects a QC information file from a plurality of registered QC information files to be described later, and as long as the QC information file is set after its contents are corrected if necessary, the writing apparatus 100 automatically generates writing data and executes writing processing. It will be specifically described.

Figure 9:
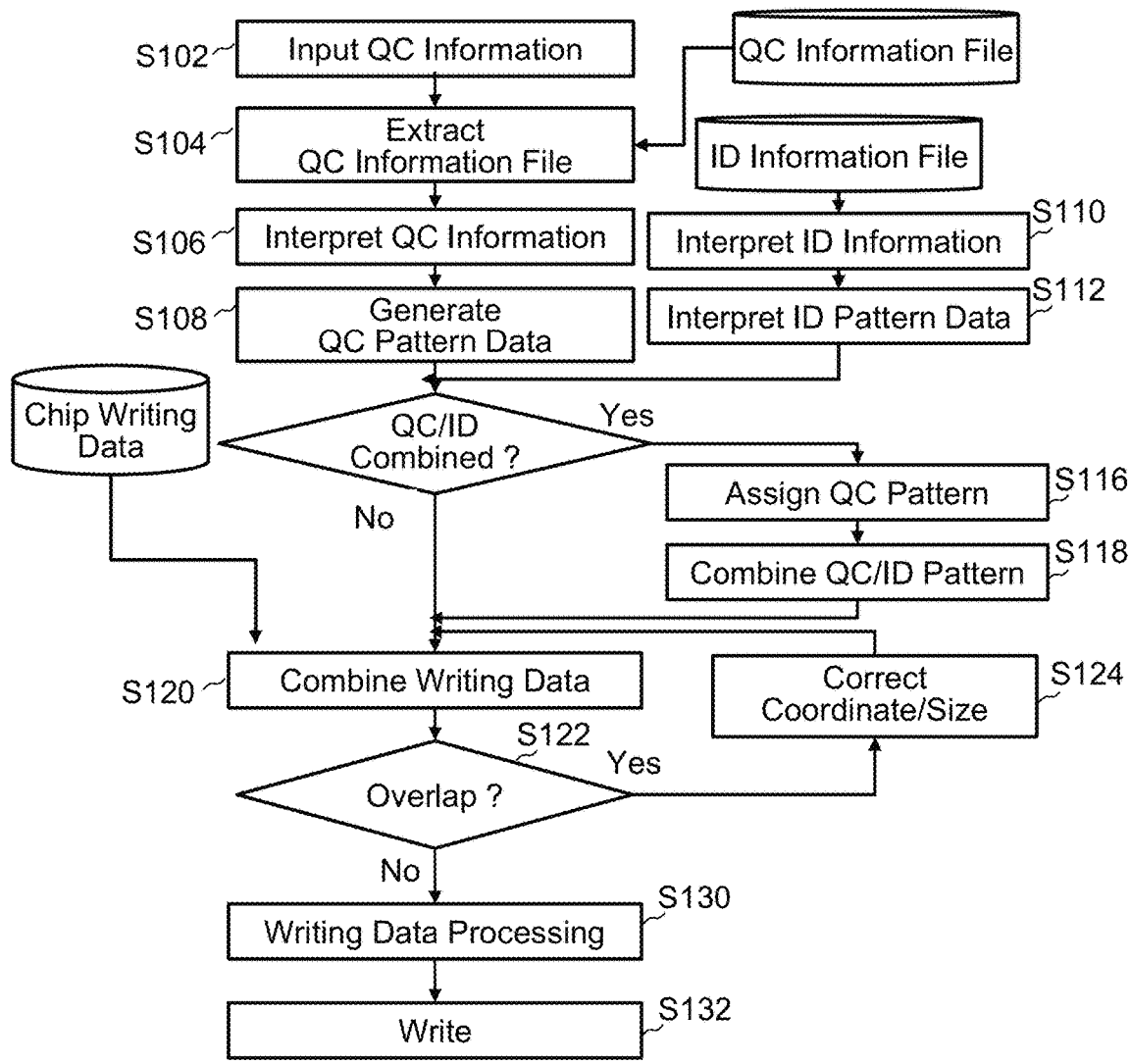
FIG. 9 is a flowchart showing main steps of a writing method according to the first embodiment.

FIG. 9 is a flowchart showing main steps of a writing method according to the first embodiment. In FIG. 9, the writing method of the first embodiment executes a series of steps: a QC information input step (S102), a QC information file extraction step (S104), a QC information interpretation step (S106), a QC pattern data generation step (S108), an ID information interpretation step (S110), an ID pattern data generation step (S112), a QC pattern assignment step (S116), a QC/ID pattern combination step (S118), a writing data combination step (S120), a verification step (S122), a coordinate/size correction step (S124), a writing data processing step (S130), and a writing step (S132).

In the QC information input step (S102), the user selects a QC information file by using the data input I/F circuit 125. Specifically, the user, using the data input I/F circuit 125, inputs character information or selects an item for specifying a QC pattern (apparatus quality check pattern) for evaluating the apparatus quality of the writing apparatus 100.

FIG. 10 shows an example of an input interface screen according to the first embodiment. The case of FIG. 10 shows examples of input items displayed on the screen of the data input I/F circuit 125. In FIG. 10, first, there are shown input box icons of "ON" and "OFF" to select ID writing or not. In the case of writing the contents of ID information defined in the ID information file stored in the magnetic disk drive 144, the input box "ON" needs to be ticked by clicking on the input box icon of "ON" by using a mouse, etc. (not shown). In the case of not writing the contents of ID information, the input box "OFF" needs to be ticked by clicking on the input box icon of "OFF". Next are shown input box icons of "write" and "not write" to select QC pattern writing or not. In the case of writing a certain QC pattern, the input box "write" needs to be ticked by clicking on the input box icon of "write". In the case of not writing a QC pattern, the input box "not write" needs to be ticked by clicking on the input box icon of "not write". Next, in the case of writing a certain QC pattern, shown is the selection box for selecting one from a plurality of registered QC information files. In the example of FIG. 10, selecting can be performed by clicking on the icon denoted by "▼", and clicking one of filenames (identification information) of a plurality of listed QC information files. FIG. 10 shows the case where the QC information file named "Solid" is selected. Then, if there is no mistake in the input and selected contents, the "writing registration" button needs to be ticked to complete inputs in the QC information input step (S102).

In the QC information file extraction step (S104), when the input box of to "write" a QC pattern is ticked, the QC information file extraction unit 10 inputs the filename (identification information) of the QC information file selected on the screen of the data input I/F circuit 125, and extracts a corresponding QC information file from a plurality of QC information files stored in the storage device 142. The contents of the extracted QC information file are switched to be displayed from the input item screen described above of the data input I/F circuit 125.

FIG. 11 shows an example of a QC information file according to the first embodiment. In the QC information file (apparatus quality check pattern information file), there is defined rewritable character information which specifies the shape and arrangement layout of a QC pattern for evaluating the apparatus quality of the writing apparatus 100. In the case of FIG. 11, examples of thirteen parameters and setting statuses of the respective parameters are shown as the QC information file whose filename is "SOLID". In "TO BE COMBINED WITH ID OR NOT" used as the parameter 1, it is set whether a QC pattern and an ID pattern indicating ID information are to be combined or not. FIG. 11 shows the case where "ON" is set which indicates the QC pattern and the ID pattern denoting ID information are to be combined. In the case of not combining, it should be rewritten to "OFF" by using the K/B 122, etc. For example, when writing a QC pattern in a chip region, since it is not the outside of the chip region to write an ID pattern, no combining is performed. In such a case, "OFF" should be input. Thus, the writing position of the QC pattern can be set at an arbitrary position inside or outside of a chip region.

In "REFERENCE COORDINATE X" used as the parameter 2, the x-direction coordinate of the reference position (e.g., lower left corner) of a QC pattern is set. In the example of FIG. 11, the reference coordinate in the x direction is set to "X1". If other coordinate value is desirable, the coordinate "X1" can be rewritten to a desirable coordinate value by using the K/B 122, etc.

In "REFERENCE COORDINATE Y" used as the parameter 3, the y-direction coordinate of the reference position (e.g., lower left corner) of a QC pattern is set. In the example of FIG. 11, the reference coordinate in the y direction is set to "Y1". If other coordinate value is desirable, the coordinate "Y1" can be rewritten to a desirable coordinate value by using the K/B 122, etc.0

In "LOWER LEFT OF BEAM REGION FOR QC PATTERN" used as the parameter 4, beam identification coordinates corresponding to the lower left of beams used for writing a QC pattern in multiple beams are set. In the case of FIG. 11, identification coordinates "1, 1" are set. If other identification coordinates are desirable, the identification coordinates "1, 1" can be rewritten to a desirable coordinate value by using the K/B 122, etc.

In "UPPER RIGHT OF BEAM REGION FOR QC PATTERN" used as the parameter 5, beam identification coordinates corresponding to the upper right of beams used for writing a QC pattern in multiple beams are set. In the case of FIG. 11, identification coordinates "m, n" are set. If other identification coordinates are desirable, the identification coordinates "m, n" can be rewritten to a desirable coordinate value by using the K/B 122, etc. When the identification coordinates at the lower left of beams to use are set to "1, 1" and those at the upper right are set to "m, n", it means that the whole of multiple beams whose number is m×n is used.

In "WRITING TIMING" used as the parameter 6, the time timing for writing a QC pattern is set. In the example of FIG. 11, the time timing "BEFORE: Y, DURING: Y, AFTER: Y", is set, where Y indicates "yes". If other time timing is desirable, "BEFORE: Y, DURING: Y, AFTER: Y" can be rewritten to other desirable time timing by using the K/B 122, etc. When the time timing is set to "BEFORE: Y, DURING: Y, AFTER: Y", it indicates that the time timing for writing a QC pattern is "before starting writing", "after stripe region writing performed intermediately", and "after writing a chip pattern". Thus, the time timing for writing a QC pattern can be set arbitrarily.

In "WRITING INTERVAL" used as the parameter 7, there is shown an arrangement pitch between QC patterns in the case of a plurality of QC patterns being written. In the example of FIG. 11, the arrangement pitch "p×n" is set. If other arrangement pitch is desirable, "p×n" can be rewritten to a desirable arrangement pitch by using the K/B 122, etc. When the arrangement pitch is set to "p×n", it indicates that the arrangement pitch between QC patterns is a value obtained by multiplying p being the pitch between beams of the multiple beams by n being the number of beams in the y direction of the multiple beams. Thus, the writing interval for writing a QC pattern can be set arbitrarily.

In "NUMBER OF WRITING PATTERNS IN X DIRECTION" used as the parameter 8, there is shown the number of QC patterns arranged in the x direction in the case a plurality of QC patterns being written. In the example of FIG. 11, the number of patterns arranged in the x direction is set to "3". If other number of patterns in the x direction is desirable, "3" can be rewritten to a desirable number of patterns in the x direction by using the K/B 122, etc.

In "NUMBER OF WRITING PATTERNS IN Y DIRECTION" used as the parameter 9, there is shown the number of QC patterns arranged in the y direction in the case a plurality of QC patterns being written. In the example of FIG. 11, the number of patterns arranged in the y direction is set to "3". If other number of patterns in the y direction is desirable, "3" can be rewritten to a desirable number of patterns in the y direction by using the K/B 122, etc. When the number of patterns arranged in the x direction is "3" and the number of patterns arranged in the y direction is "3", a plurality of QC patterns are written by the array arrangement of 3×3 (=9). Thus, the number of QC patterns to be written can be set arbitrarily.

In "REFERENCE DOSE" used as the parameter 10, a reference dose is shown which is an example of writing conditions for writing a QC pattern separately from a chip pattern. In the example of FIG. 11, the reference dose is set to "d1". If other reference dose is desirable because of difference of conditions, such as a substrate and a resist type, "d1" can be rewritten to a desirable reference dose by using the K/B 122, etc.

In "BACKSCATTER COEFFICIENT" used as the parameter 11, a backscatter coefficient η is shown which is an example of writing conditions for writing a QC pattern separately from a chip pattern. In the example of FIG. 11, the backscatter coefficient is set to "η1". If other backscatter coefficient is desirable because of difference of conditions, such as a substrate and a resist type, "η1" can be rewritten to a desirable backscatter coefficient by using the K/B 122, etc.

In "PERFORM PROXIMITY EFFECT CORRECTION OR NOT" used as the parameter 12, it is shown whether or not to perform proximity effect correction being an example of writing conditions for writing a QC pattern separately from a chip pattern. FIG. 11 shows the case where the proximity effect correction is set to "ON". If not performing proximity effect correction because of difference of conditions, such as a substrate and a resist type, the proximity effect correction "ON" should be rewritten to "OFF".

In "WRITING PATTERN TYPE" used as the parameter 13, there is shown a type of figure pattern configuring a QC pattern. In the example of FIG. 11, the writing pattern type is set to "SOLID". If other pattern type is desirable, "SOLID" can be rewritten to a desirable pattern type by using the K/B 122, etc.

As described above, according to the first embodiment, it is possible to arbitrarily select one QC information file from a plurality of registered QC information files, and arbitrarily correct the file contents, such as a QC pattern arrangement layout, writing position, writing time, and writing conditions. Such selecting and correcting can be executed based on character information without generating writing data.

Although the format of the QC information file is a tabular form in the example of FIG. 11, it is not limited thereto. For example, a form of just enumerating character information may also be accepted.

Then, the contents of the QC information file are determined and registered by executing the registration button (not shown) on the screen of the data input I/F circuit 125 by moving the cursor with the cursor key of the K/B 122, or clicking it with the mouse, etc. (not shown).

The setting unit 19 sets writing parameters (writing time, writing conditions, etc.) such as the parameters 4 to 6, and 10 to 12 described above for writing a QC pattern defined in the determined and registered QC information file, independently of writing parameters (writing time, writing conditions, etc.) for writing an actual chip pattern defined in chip writing data.

Figure 12:
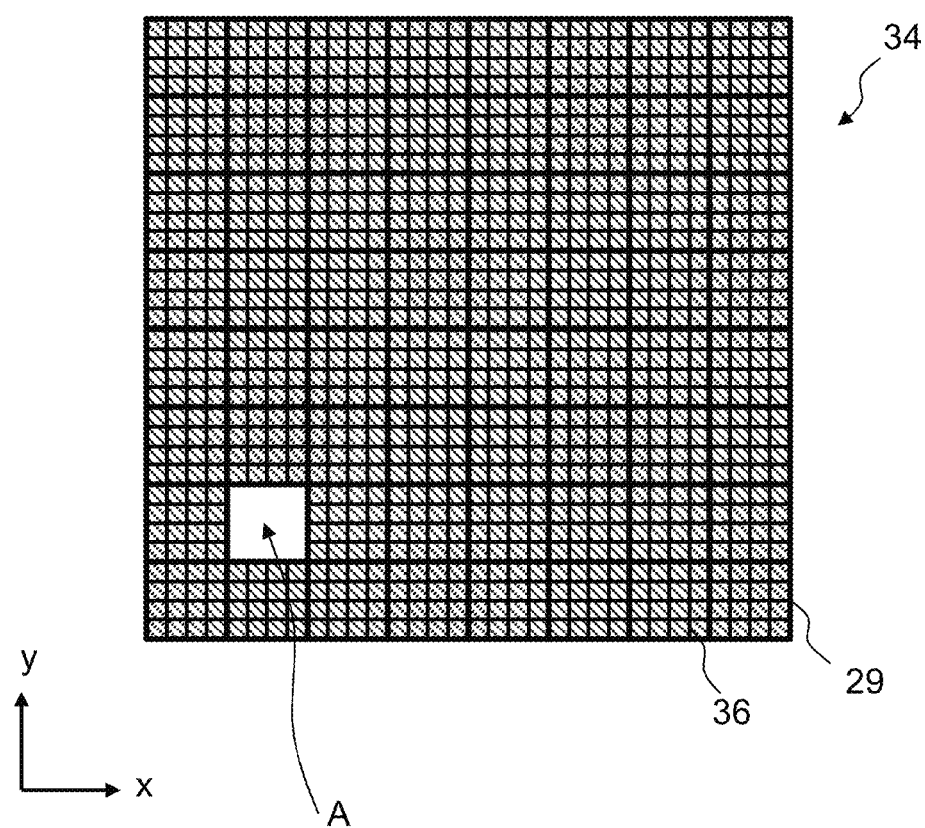
FIG. 12 shows an example of a QC pattern according to the first embodiment.

FIG. 12 shows an example of a QC pattern according to the first embodiment. FIG. 12 shows a QC pattern whose writing pattern type is set to "SOLID". One of items for evaluating the apparatus quality of a multi-beam writing apparatus is that all the beams can irradiate normally. There is a case where a beam always in the OFF state may occur due to failure of the amplifier 46 of the blanker of the blanking aperture array mechanism 204 or operation failure such as a short circuit between electrodes, etc. Therefore, a solid pattern is written by filling the inside of each sub-irradiation region 29 in the irradiation region 34 with irradiation of respective corresponding beams. Then, by developing and ashing the target object 101, existence or nonexistence of the sub-irradiation region 29 which was not written can be checked. If there is a sub-irradiation region 29(A) which was not written, it turns out that the beam corresponding to this sub-irradiation region 29 is a defective beam always in the OFF state.

Figure 13:
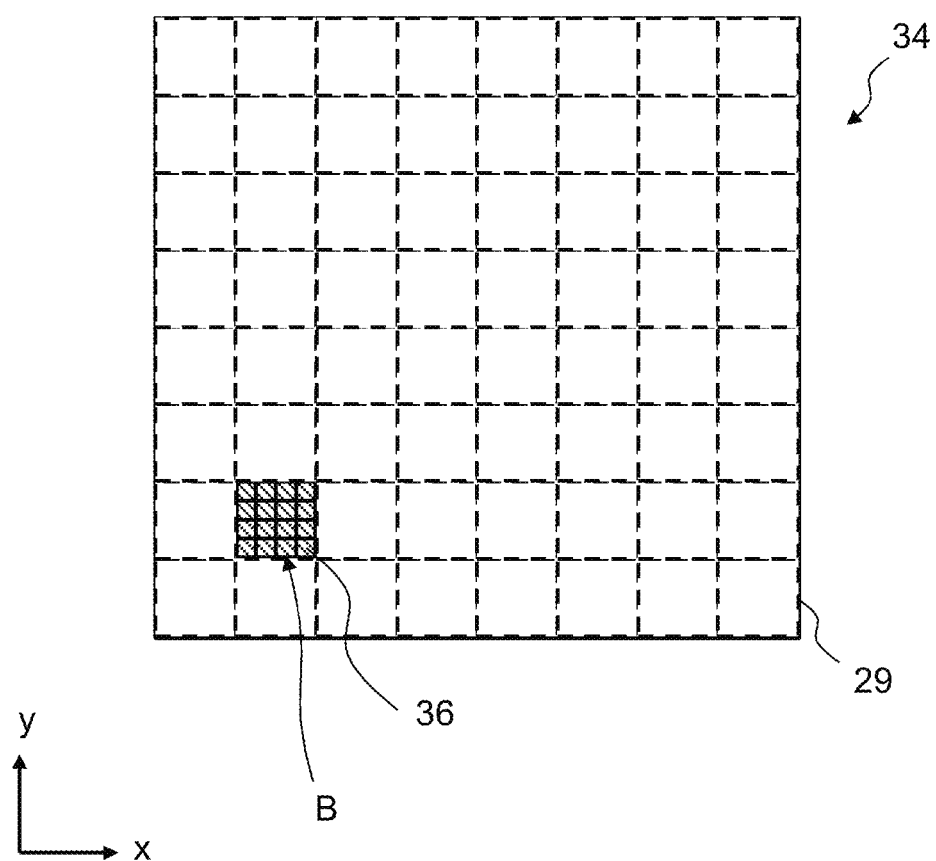
FIG. 13 shows another example of a QC pattern according to the first embodiment.

FIG. 13 shows another example of a QC pattern according to the first embodiment. FIG. 13 shows a QC pattern whose writing pattern type is set to "REVERSE SOLID". As one of items for evaluating the apparatus quality of a multi-beam writing apparatus, it can be mentioned that all the beams can irradiate normally. There is a case where a beam always in an ON state may occur due to operation failure such as failure of the amplifier 46 of the blanker of the blanking aperture array mechanism 204. Therefore, a reverse solid pattern is written by filling the inside of each sub-irradiation region 29 in the irradiation region 34 with empty irradiation, having a zero irradiation time, of respective corresponding beams. Then, by developing and ashing the target object 101, existence or nonexistence of the sub-irradiation region 29 which was written can be checked. If there is a sub-irradiation region 29(B) which was written, it turns out that the beam corresponding to this sub-irradiation region 29 is a defective beam always in the ON state.

FIGS. 14A to 14C show other examples of a QC pattern according to the first embodiment. FIGS. 14A to 14C show QC patterns whose writing pattern type is set to "CONTACT PATTERN". In the examples of FIGS. 14A to 14C, writing is performed with 4×4 multiple beams. In the cases of FIGS. 14A to 14C, a quadrangular (rectangular, square) pattern (contact pattern) is written in a manner such that each beam irradiates a region having a size of a ½ pitch between beams in the x and y directions in a corresponding sub-irradiation region 29 in the irradiation region 34. Even when the beam size of each beam is smaller than the measurement limit of the position measuring instrument, a contact pattern of the size equal to or larger than the measurement limit of the position measuring instrument can be written by writing each region of a size of a ½ pitch between beams in the x and y directions, for example. Then, after developing and ashing the target object 101, the edge position of the formed resist pattern should be measured by the position measuring instrument.

Now, as another one of the items for evaluating the apparatus quality of a multi-beam writing apparatus, it can be mentioned that the irradiation position of each beam has no deviation. Regarding this, as shown in FIG. 14A, when a contact pattern (C) being a part of the measured 4×4 contact patterns is deviated, it turns out that the irradiation position of the beam which wrote the contact pattern (C) has been deviated. If a plurality of QC patterns are written with a time difference based on the writing timing, the position deviation amount depending on time can be acquired.

Moreover, as another one of the items for evaluating the apparatus quality of a multi-beam writing apparatus, it can be mentioned that the shot size of each beam is fixed. Regarding this, as shown in FIG. 14B, when there is deviation of the pattern size of a contact pattern (D) being apart of the measured 4×4 contact patterns, it turns out that an error has occurred in the shot size of the beam which wrote the contact pattern (D). As a cause for this, an error may have occurred in the size of the hole 22 in the shaping aperture array substrate 203, for example. Alternatively, irradiation time control may be in failure due to trouble of the control circuit 41 of the blanker of the blanking aperture array mechanism 204. If a plurality of QC patterns are written with a time difference based on the writing timing, the size error amount depending on time can be acquired.

Moreover, as another one of the items for evaluating the apparatus quality of a multi-beam writing apparatus, it can be mentioned that each of local positions of multiple beams has no deviation. Regarding this, as shown in FIG. 14C, when there is position deviation in the whole of the measured 4×4 contact patterns, it turns out that the irradiation position of each of beams which wrote the 4×4 contact patterns (E) has been deviated. If a plurality of QC patterns are written with a time difference based on the writing timing, the local position deviation amount depending on time can be acquired.

Figure 15A:
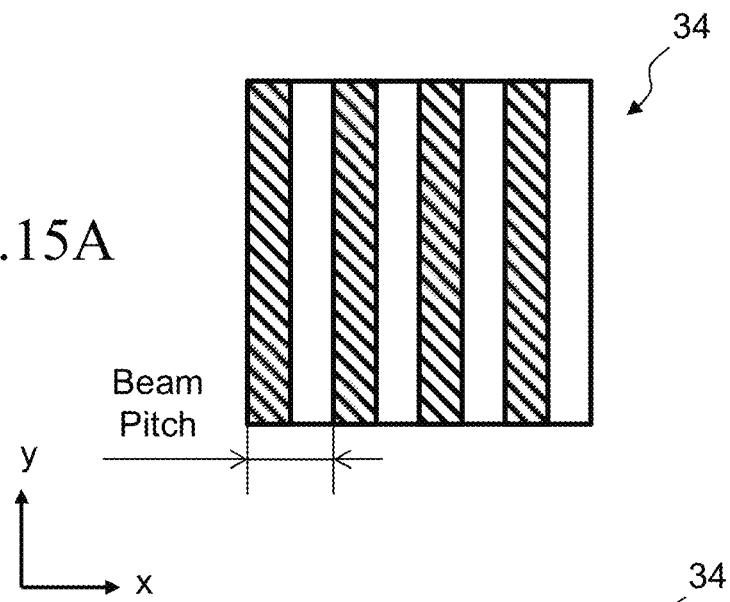
FIGS. 15A and 15B show other examples of a QC pattern according to the first embodiment.
Figure 15B:
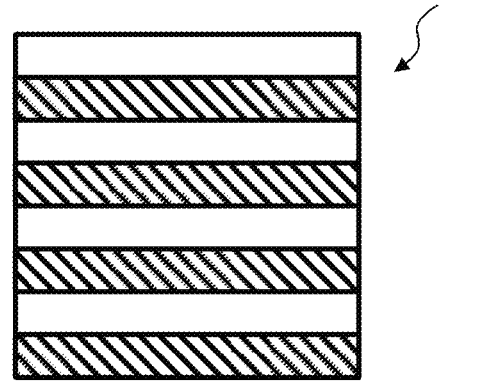

FIGS. 15A and 15B show other examples of a QC pattern according to the first embodiment. FIGS. 15A and 15B show QC patterns whose writing pattern type is set to "LINE AND SPACE PATTERN". In the examples of FIGS. 15A and 15B, writing is performed with 4×4 multiple beams 20, for example. In the case of FIG. 15A, line and space patterns repeated in the x direction are written in a manner such that each beam irradiates a region having a size of a ½ pitch between beams in the x direction and a pitch between beams in the y direction in a corresponding sub-irradiation region 29 in the irradiation region 34. Even when the beam size of each beam is smaller than the measurement limit of the position measuring instrument, a line pattern (and a space pattern) of the width size equal to or larger than the measurement limit of the position measuring instrument can be written by writing each region of a size of a ½ pitch between beams in the x direction. Then, after developing and asking the target object 101, the edge position of the formed resist pattern should be measured by the position measuring instrument.

Similarly, in the case of FIG. 15B, line and space patterns repeated in the y direction are written in a manner such that each beam irradiates a region having a size of a ½ pitch between beams in the y direction and a pitch between beams in the x direction in a corresponding sub-irradiation region 29 in the irradiation region 34. Even when the beam size of each beam is smaller than the measurement limit of the position measuring instrument, a line pattern (and a space pattern) of the width size equal to or larger than the measurement limit of the position measuring instrument can be written by writing each region of a size of a ½ pitch between beams in the y direction. Then, after developing and asking the target object 101, the edge position of the formed resist pattern should be measured by the position measuring instrument.

Now, as another one of the items for evaluating the apparatus quality of a multi-beam writing apparatus, it can be mentioned that the CD dimension should be stable. When the CD dimension (width dimension) of a line pattern (and a space pattern) is deviated from the ½ pitch size between beams, local CD dimension variation may have occurred. Alternatively, CD dimension variation depending on process may have occurred. Alternatively, an error may have occurred in the size of the hole 22 in the shaping aperture array substrate 203. Alternatively, irradiation time control may be in failure due to trouble of the control circuit 41 of the blanker of the blanking aperture array mechanism 204. Alternatively, the focus position may be shifted. If a plurality of QC patterns are written with a time difference based on the writing timing, the CD dimension variation amount depending on time can be acquired. Furthermore, it is also preferable to simultaneously write line patterns sufficiently narrower than the line patterns described above. The resolution of the writing apparatus 100 can be verified by writing a plurality of line patterns having different width dimensions, and verifying the line width of a written narrow line pattern.

If the QC information file defined by the character information described above is intact, it is impossible to write the above various QC patterns. Therefore, in the writing apparatus 100, writing data is generated from the contents of the QC information file of character information as described below.

In the QC information interpretation step (S106), the QC information file interpretation unit 11 interprets the contents of character information defined in an extracted QC information file or in a QC information file corrected after extraction.

In the QC pattern data generation step (S108), the QC pattern data generation unit 12 (writing data generation unit) inputs character information or information of a selected item to specify a QC pattern (apparatus quality check pattern) for evaluating the apparatus quality of the writing apparatus 100, and generates writing data of the QC pattern along with the contents interpreted based on the character information or the information of the selected item. The writing data of the QC pattern is generated in the same format as that of chip writing data.

In the ID information interpretation step (S110), when the input box of ID writing "ON" is ticked, the ID information file interpretation unit 13 reads an ID information file from the storage device 144, and interprets the contents of character information defined in the ID information file. As ID character information defined in the ID information file, information for identifying the target object 101 itself is defined, for example. A serial number is used for the information for identifying the target object 101 itself, and, for example, "123456" is indicated/displayed. As other ID character information, it is preferable to define, for example, date and time at which writing data is input to the writing apparatus 100. Input date and time is indicated/displayed as "INPUTDATE", for example. It is preferable that the input date and time is automatically input from the clock function installed in the control system circuit 160 in the writing apparatus 100. Of course, it may be input by the operator through the K/B 122. Furthermore, as ID character information, preferably, the serial number of the writing apparatus 100 into which the data is input, the type of the mask substrate, the serial number of the PEB apparatus to be used as a process after writing, and, the serial number of the developing device are defined. The serial number (identification information) of the writing apparatus 100 is indicated/displayed as "WRITER_123", for example. The type of the mask substrate is indicated/displayed as "EUVPLATE", for example. The serial number of the PEB apparatus is indicated/displayed as "PEB 33", for example. The serial number of the developing device is indicated/displayed as "DZV_11", for example. Furthermore, as ID character information, preferably, the layout name (name of writing data) is defined. Furthermore, as ID character information, the writing date and time at which writing processing is actually started is defined. The writing date and time is indicated/displayed as "WRITEDATE", for example. It is preferable that the writing date and time is automatically input from the clock function installed in the control system circuit 160 in the writing apparatus 100. Of course, it may be input by the operator through the K/B 122. Furthermore, as ID character information, preferably, the name of the operator of the writing apparatus 100 used for writing a target mask is defined, for example. The operator name is indicated/displayed as "OPERATOR", for example. The operator name may be input through the K/B 122 by the operator, for example. Of course, if the operator name is known in advance, it may be defined beforehand. Moreover, preferably, the size of the mask is defined. The mask size is input as "6", for example. Furthermore, preferably, the dose amount to irradiate when writing a chip pattern is defined. The dose amount is input as "10", for example. Furthermore, as ID character information, preferably, the size of an ID pattern is defined, for example. The size of the ID pattern is indicated/displayed as "25", for example. Furthermore, as ID character information, preferably, the X coordinate of the reference position of the ID pattern is defined. The X coordinate of the reference position of the ID pattern is indicated/displayed as "−70000", for example. Moreover, as ID character information, preferably, the Y coordinate of the reference position of the ID pattern is defined. The Y coordinate of the reference position of the ID pattern is indicated/displayed as "−70000", for example. Furthermore, as character information, preferably, the size (chip frame size) of a chip pattern to be written is defined, for example. The chip frame size is indicated/displayed as "10000", for example. Furthermore, as character information, preferably, the X coordinate of the reference position (chip frame reference position) of a chip pattern to be written is defined, for example. The X coordinate of the reference position of the chip pattern is indicated/displayed as "−50000", for example. Furthermore, as character information, preferably, the Y coordinate of the reference position of a chip pattern to be written is defined, for example. The Y coordinate of the reference position of the chip pattern is indicated/displayed as "−50000", for example.

In the ID pattern data generation step (S112), the ID pattern data generation unit 14 inputs character information of the ID information file, and generates writing data of an ID pattern along with the contents interpreted based on the character information. The writing data of the ID pattern is generated in the same format as that of chip writing data. It is preferable that an ID pattern is formed as a figure with numbers, characters such as alphabets, QR codes (registered trademark), or barcodes with respect to at least a part of information in the character information described above other than coordinates and sizes.

In the QC pattern assignment step (S116), when "TO BE COMBINED WITH ID OR NOT" is defined as "ON" in the QC information file, the QC/ID pattern combination unit 15 assigns a QC pattern to an ID pattern. The assignment position of the QC pattern is based on values of "REFERENCE COORDINATE X" and "REFERENCE COORDINATE Y" defined in the QC information file. When "TO BE COMBINED WITH ID OR NOT" is defined as "OFF" in the QC information file, it proceeds to the writing data combination step (S120).

In the QC/ID pattern combination step (S118), the QC/ID pattern combination unit 15 combines writing data of the ID pattern and writing data of the QC pattern.

Figure 16:
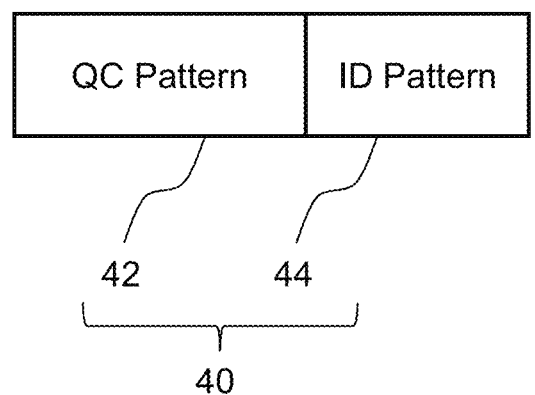
FIG. 16 shows an example of a QC pattern region and an ID pattern region according to the first embodiment.

FIG. 16 shows an example of a QC pattern region and an ID pattern region according to the first embodiment. FIG. 16 shows the case where a QC pattern region 42 and an ID pattern region 44 do not overlap with each other. By combining the writing data of the ID pattern and the writing data of the QC pattern, the writing region defined by writing data of the QC/ID pattern after the combination becomes a QC/ID pattern region 40 obtained by combining the QC pattern region 42 and the ID pattern region 44. Although the QC pattern region 42 and the ID pattern region 44 are adjacent to each other in the example of FIG. 16, it is not limited thereto. The regions may be separated from each other. Moreover, the regions may overlap with each other.

Figure 17A:
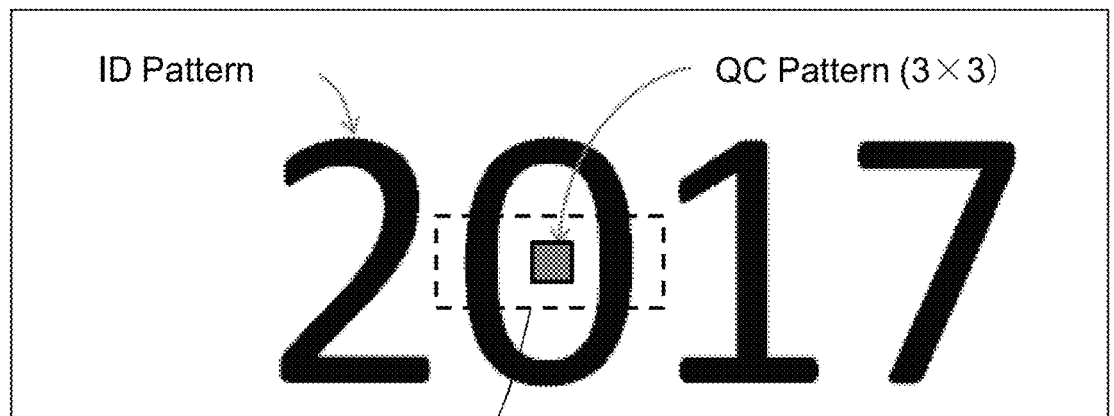
FIGS. 17A and 17B show other examples of a QC pattern region and an ID pattern region according to the first embodiment.
Figure 17B:
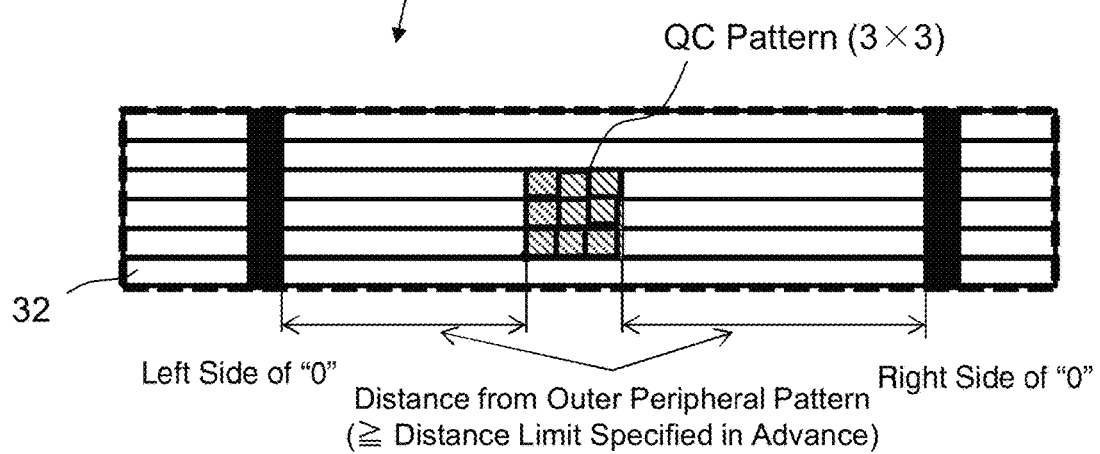

FIGS. 17A and 17B show other examples of a QC pattern region and an ID pattern region according to the first embodiment. FIGS. 17A and 17B show the case where the QC pattern region 42 and the ID pattern region 44 overlap with each other. In particular, FIGS. 17A and 17B show an example of the case where the QC pattern has been assigned to inside the ID pattern. FIG. 17A shows the case where, as an ID pattern, a QC pattern of 3×3 defined in the QC information file is arranged in the zero "0" of the number pattern "2017". FIG. 17B shows an enlarged view of the neighborhood of the arrangement position of the QC pattern. The ID pattern is divided in the y direction into a plurality of stripe regions 32, for example. The size of one QC pattern composed of a solid pattern described above, for example, has been set to be the same as that of the irradiation region 34. In the case of FIG. 17B, the width size of the stripe region 32 has been set to be the same as that of the irradiation region 34. Preferably, each QC pattern is arranged not to straddle the boundary of the stripe region 32. Therefore, preferably, "REFERENCE COORDINATE Y" defined in the QC information file is set according to the boundary of the stripe region 32. When the width size of the stripe region 32 is set to be the same as that of the irradiation region 34, "REFERENCE COORDINATE Y" should be set to the position far from by the integral multiple of the size of the irradiation region 34 from the lower left origin of the QC/ID pattern region 40 (here, ID pattern region 44) used as the origin for dividing into a plurality of stripe regions 32, for example. At the same time, preferably, "WRITING INTERVAL" indicating an arrangement pitch between QC patterns is set to be an integral multiple of the width size of the stripe region 32. In the example of FIG. 11, the arrangement pitch is set to "p×x", which is the same arrangement pitch as that of the width size of the stripe region 32. In addition, it is also preferable to additionally set, in the QC information file, a parameter of the minimum distance from the end of a pattern other than the QC pattern, where the pattern is located around the QC pattern. Thereby, when a QC pattern is assigned to inside an ID pattern, if the QC/ID pattern combination unit 15 arranges the QC pattern based on "REFERENCE COORDINATE X" and "REFERENCE COORDINATE Y", there may be a case where the distance from the end (here, the left end and the right end of the inner periphery of "0" pattern) of a surrounding pattern is less than the minimum distance having been set. It is also preferable, in such a case, to configure the QC/ID pattern combination unit 15 to automatically correct the position to be equal to or greater than the minimum distance. Similarly, when a QC pattern is arranged base on "REFERENCE COORDINATE X" and "REFERENCE COORDINATE Y", if the QC pattern straddles the boundary of the stripe region 32, it is also preferable to configure the QC/ID pattern combination unit 15 to automatically correct "REFERENCE COORDINATE Y" according to the boundary of the stripe region 32. However, it is not limited thereto, and, of course, it is also preferable to return to the screen of the data input I/F circuit 125, and rewrite the parameter of the QC information file through the K/B 122, etc. In multiple beam writing, when the writing is performed by constant speed movement of the stage, it becomes possible, by combining writing data of the ID pattern and writing data of the QC pattern, to write the QC pattern together with the ID pattern within the time to be originally used for writing the ID pattern. That is, compared to the case where writing processing of the ID pattern and writing processing of the QC pattern are carried out independently, it becomes possible to reduce the time to write the QC pattern, thereby shortening the whole writing time.

In the writing data combination step (S120), the writing data combination unit 16 (combination unit) inputs writing data (chip writing data) of an actual chip pattern to be written onto the target object 101 from the storage device 140, and combines chip writing data and writing data of a QC pattern (here, writing data of QC/ID pattern).

In the verification step (S122), the verification unit 17 verifies whether the chip pattern indicated by chip writing data and the QC pattern (here, QC/ID pattern) indicated by QC pattern writing data (here, QC/ID pattern writing data) overlap with each other.

Figure 18A:
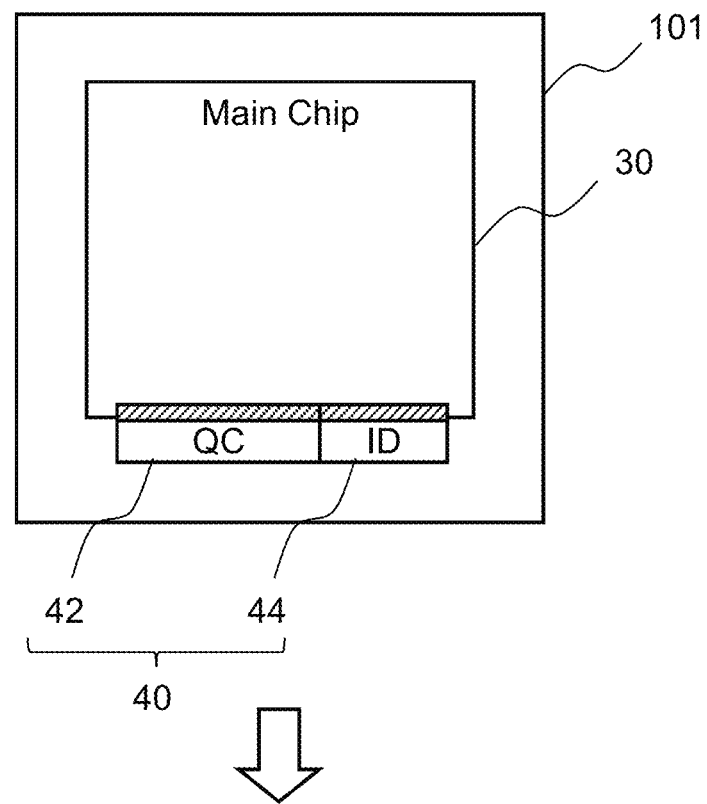
FIGS. 18A and 18B are conceptual diagrams for explaining the contents of verification according to the first embodiment.
Figure 18B:
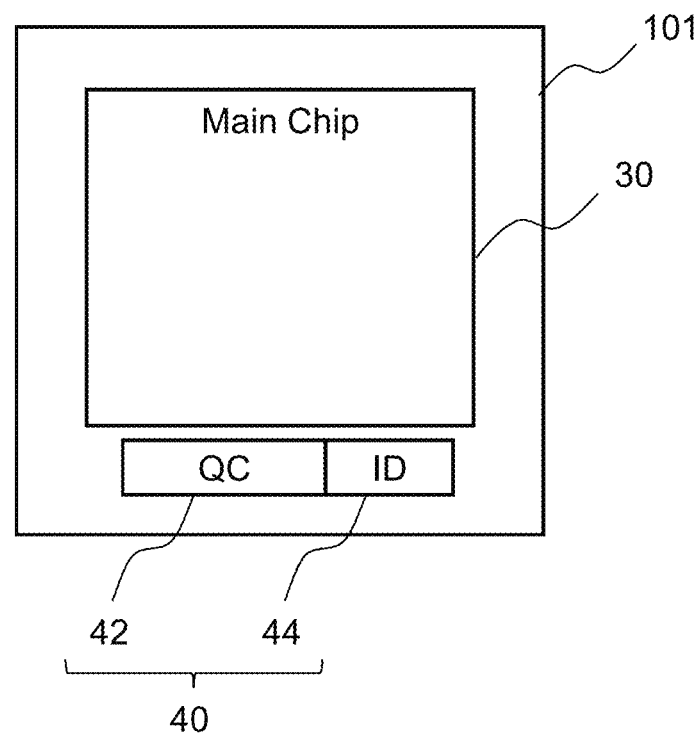

FIGS. 18A and 18B are conceptual diagrams for explaining the contents of verification according to the first embodiment. FIG. 18A shows the state where the QC/ID pattern 40 (QC pattern region 42 and ID pattern region 44) overlaps with the chip region 30 of the target object 101. In such a case, the verification unit 17 determines "NG" as a verification result. Then, it proceeds to the coordinate/size correction step (S124). On the other hand, FIG. 18B shows the state where the QC/ID pattern 40 (QC pattern region 42 and ID pattern region 44) do not overlap with the chip region 30 of the target object 101. In such a case, the verification unit 17 determines "OK" as a verification result. Then, it proceeds to the writing data processing step (S130). This overlapping verification may be performed based on combined writing data.

In the coordinate/size correction step (S124), the coordinate/size correction unit 18 (correction unit) corrects the writing position of a QC pattern when the actual chip pattern and the QC pattern overlap with each other. Specifically, when the QC/ID pattern region 40 (QC pattern region 42 and ID pattern region 44) overlaps with the chip region 30, the coordinate/size correction unit 18 corrects "REFERENCE COORDINATE X" and "REFERENCE COORDINATE Y" or "WRITING INTERVAL" of the QC pattern defined in the QC information file. Furthermore, it corrects the reference position of the ID pattern or the size of the ID pattern defined in the ID information file. Alternatively, it corrects the reference position of the QC/ID pattern region 40.

After correcting the data, it returns to the writing data combination step (S120). Then, each step from the writing data combination step (S120) to the coordinate/size correction step (S124) is repeated until it becomes, in the verification step (S122), the state in which the chip pattern and the QC pattern (here, QC/ID pattern) do not overlap with each other. As described above, the writing data combination unit 16 (combination unit) combines the chip writing data and the writing data of the QC pattern (here, writing data of QC/ID pattern) such that patterns do not overlap with each other.

Although, in the example described above, the QC pattern (here, QC/ID pattern) is arranged outside the frame of the chip region 30, it is not limited thereto. Thus, when arranging the QC pattern in the chip region 30, similarly, the writing data combination unit 16 (combination unit) combines both the writing data such that patterns do not overlap with each other.

As described above, it is possible in the writing apparatus 100 to automatically generate writing data of QC patterns used in the writing apparatus 100. Furthermore, it is possible to generate writing data such that the actual chip pattern and the QC pattern do not overlap with each other. Furthermore, it is possible to reduce the operations that the user, each time, designs a QC pattern necessary for acquiring the apparatus quality to be evaluated by the user for a chip pattern layout, and that the user, each time, embeds the designed QC pattern into the chip pattern layout. Moreover, since writing parameters have been set as defaults in the QC information file in advance, it is possible to reduce the operation that the user, each time, examines writing parameters for the mask or evaluation items, thereby greatly reducing the possibility of setting mistakes.

In the writing data processing step (S130), with respect to writing data combined not to overlap the chip pattern with the QC pattern (here, QC/ID pattern), the writing data processing unit 70 generates shot data (irradiation time data of each pixel) by performing data processing in multiple stages. Specifically, it operates as described below.

First, in a rasterizing step, the writing data processing unit 70 reads the combined writing data, and calculates, for each pixel 36, a pattern area density ρ' in the pixel 36 concerned each. This processing is performed for each stripe region 32, for example.

In a dose calculation step, first, the writing data processing unit 70 virtually divides the writing region (here, for example, stripe region 32) into a plurality of proximity mesh regions (mesh regions for proximity effect correction calculation) by a predetermined size. The size of the proximity mesh region is preferably about ⅒ of the influence range of the proximity effect, such as about 1 μm. The writing data processing unit 70 calculates, for each proximity mesh region, a pattern area density ρ of a pattern arranged in the proximity mesh region concerned.

Next, the writing data processing unit 70 calculates, for each proximity mesh region, a proximity-effect correction irradiation coefficient $D_p(x)$ (correction dose) for correcting a proximity effect. An unknown proximity-effect correction irradiation coefficient $D_p(x)$ can be defined by a threshold value model for proximity-effect correction, which is the same as the one used in a conventional method where a backscatter coefficient η, a dose threshold value Dth of a threshold value model, a pattern area density ρ, and a distribution function g(x) are used. When proximity-effect correction is defined as "OFF" in the QC information file, the calculation of the $D_p(x)$ can be omitted deeming the proximity-effect correction irradiation coefficient $D_p(x)=1$ in the region of the QC pattern (here, QC/ID pattern).

Next, the writing data processing unit 70 calculates, for each pixel 36, an incident dose D(x) (dose amount) with which the pixel 36 concerned is irradiated. The incident dose D(x) can be calculated by multiplying a pre-set reference dose, a proximity-effect correction irradiation coefficient $D_p$, and a pattern area density ρ', for example. The reference dose can be defined by Dth/(½+η), for example. Thereby, it is possible to obtain an originally desired incident dose D(x) for which the proximity effect has been corrected. When the reference dose is defined separately in the QC information file, an incident dose D(x) can be calculated using the reference dose defined in the QC information file with respect to the region of the QC pattern (here, QC/ID pattern).

The writing data processing unit 70 creates an irradiation time data map (1) where the irradiation time for each pixel 36 is defined by way of converting an incident dose D(x) for each pixel 36 into an irradiation time t by performing gradation by gray scale levels using a predetermined quantization unit A.

In an irradiation time data processing step, the writing data processing unit 70 reads an irradiation time data map (1), and rearranges it in order of shot in accordance with the writing sequence according to the first embodiment. Then, the writing control unit 72 transmits the irradiation time t data to the deflection control circuit 130 in order of shot.

In the writing step (S132), the deflection control circuit 130 outputs a blanking control signal to the blanking aperture array mechanism 204 in order of shot, and a deflection control signal to the DAC amplifier units 132 and 134 in order of shot. Then, based on the combined writing data, the writing mechanism 150 writes an actual chip pattern and a QC pattern (here, QC/ID pattern) on the target object 101 by using electron beams (multiple beams 20).

As described above, according to the first embodiment, writing data of QC patterns used in the writing apparatus 100 of multi-beam system can be automatically generated in the writing apparatus 100. Furthermore, writing can be performed such that an actual chip pattern and a QC pattern do not overlap with each other.

Second Embodiment

The first embodiment described above explains the case where an actual chip pattern and a QC pattern are written using the multiple beams 20, but it is not limited thereto. A second embodiment below describes the case where an actual chip pattern and a QC pattern are written using a single beam.

Figure 19:
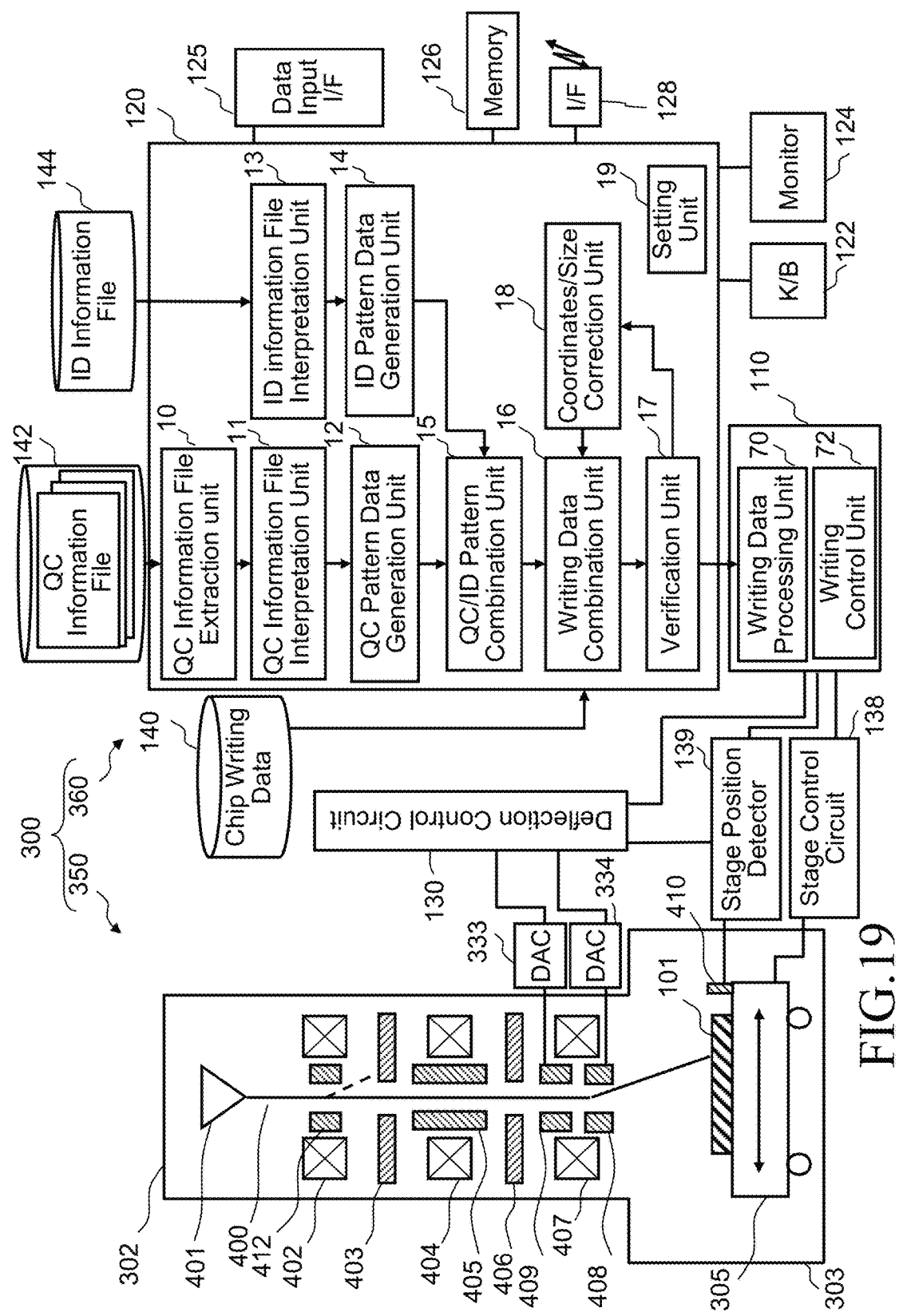
FIG. 19 is a conceptual diagram showing a configuration of a writing apparatus according to a second embodiment.

FIG. 19 is a conceptual diagram showing a configuration of a writing apparatus according to the second embodiment. As shown in FIG. 19, a writing apparatus 300 includes a writing mechanism 350 and a control system circuit 360. The writing apparatus 300 is an example of a charged particle beam writing apparatus. Particularly, it is an example of a variable shaped beam (VSB) type writing apparatus. The writing mechanism 350 includes an electron optical column 302 and a writing chamber 303. In the electron optical column 302, there are arranged an electron gun 401, an illumination lens 402, a blanking deflector (blanker) 412, a first shaping aperture substrate 403, a projection lens 404, a deflector 405, a second shaping aperture substrate 406, an objective lens 407, a main deflector 408, and a sub deflector 409. In the writing chamber 303, there is arranged an XY stage 305 which is movable at least in the x-y directions. On the XY stage 305, there is placed a target object or "sample" 101 (substrate) which serves as a writing target coated with resist. The target object 101 may be an exposure mask, a silicon wafer, and the like used for manufacturing semiconductor devices. The mask may be a mask blank. Moreover, a mirror 410 for measuring the position of the XY stage 305 is arranged on the XY stage 305.

The control system circuit 360 includes control computers 110 and 120, the keyboard (K/B) 122, the monitor 124, the data input interface (I/F) circuit 125, the memory 126, the external interface (I/F) circuit 128, the deflection control circuit 130, digital-to-analog converting (DAC) amplifier units 333 and 334, the stage control circuit 138, the stage position detector 139, and storage devices 140, 142, and 144, such as magnetic disk drives. The control computers 110 and 120, the K/B 122, the monitor 124, the data input I/F circuit 125, the memory 126, the external I/F circuit 128, the deflection control circuit 130, the stage control circuit 138, the stage position detector 139, and the storage devices 140, 142, and 144 are connected with each other through a bus (not shown).

The deflection control circuit 130 is connected to the DAC amplifier units 333 and 334. Outputs of the DAC amplifier unit 333 are connected to the sub deflector 409. Outputs of the DAC amplifier unit 334 are connected to the main deflector 408. The stage position detector 139 irradiates the mirror 410 on the XY stage 305 with a laser beam, and receives a reflected light from the mirror 410. Then, the stage position detector 139 measures the position of the XY stage 305 by using the principle of the laser interference based on information on the reflected light. The measured position information is output to the control computer 110 and the deflection control circuit 130. The configuration of the control computer 110 and the configuration of the control computer 120 are the same as those in FIG. 1.

FIG. 19 shows configuration elements necessary for describing the second embodiment. It should be understood that other configuration elements generally necessary for the writing apparatus 300 may also be included therein. The main steps of a writing method of the second embodiment are the same as those of FIG. 9. The contents of the present embodiment are the same as those of the first embodiment except for what is specifically described below.

The contents of each step from the QC information input step (S102) to the coordinate/size correction step (S124) in FIG. 9 are the same as those of the first embodiment. Therefore, also in the second embodiment, similarly to the first embodiment, it is possible in the writing apparatus 300 to automatically generate writing data of QC patterns used in the writing apparatus 300. Furthermore, it is possible to generate writing data such that the actual chip pattern and the QC pattern do not overlap with each other. Furthermore, it is possible to reduce the operations that the user, each time, designs a QC pattern necessary for acquiring the apparatus quality to be evaluated by the user for a chip pattern layout, and that the user, each time, embeds the designed QC pattern into the chip pattern layout. Moreover, since writing parameters have been set as defaults in the QC information file in advance, it is possible to reduce the operation that the user, each time, examines writing parameters for the mask or evaluation items, thereby greatly reducing the possibility of setting mistakes.

In the writing data processing step (S130), with respect to writing data combined not to overlap the chip pattern with the QC pattern (here, QC/ID pattern), the writing data processing unit 70 generates shot data unique to the writing apparatus by performing data processing in multiple stages. For each figure pattern defined in the combined writing data, the writing data processing unit 70 divides a figure pattern into a plurality of shot figures by the size that can be irradiated by one shot of an electron beam 400. Then, shot data is generated for each shot figure. The shot data defines the figure type, coordinates, figure size, and the like of the shot figure. Moreover, the writing data processing unit 70 separately divides the chip region 30 into a plurality of proximity mesh regions described above, and creates a dose map in which an incident dose D(x) for each proximity mesh region is defined. The incident dose D(x) can be defined by multiplying the proximity-effect correction irradiation coefficient $D_p(x)$ by the reference dose. When proximity-effect correction is defined as "OFF" in the QC information file, the calculation of the $D_p(x)$ can be omitted deeming the proximity-effect correction irradiation coefficient $D_p(x)=1$ in the region of the QC pattern (here, QC/ID pattern). When "REFERENCE DOSE" is separately defined in QC information file, with respect to the region of a QC pattern (here, QC/ID pattern), the value of "REFERENCE DOSE" defined in the QC information file is applied as a reference dose used for calculating the incident dose D(x).

In the writing step (S132), the writing control unit 72 performs writing processing by controlling the deflection control circuit 130 and the writing mechanism 350. The writing mechanism 150 writes an actual chip pattern and a QC pattern (here, QC/ID pattern) on the target object 101 with the electron beam 400.

In the variable shaped beam type writing apparatus 300, the chip region 30 to be written on the target object 101 shown in FIG. 6 is virtually divided by the width deflectable by the main deflector 408 (first deflector) into a plurality of stripe regions 32 arrayed in a strip form in the y direction. The region, in a plurality of stripe regions 32, which is surrounded in both the x and y directions by the width deflectable by the main deflector 408 (first deflector) is a deflection region 22 (main deflection region) of the main deflector 408 (first deflector). The main deflection region is not formed at a fixed position in the stripe region 32, but serves as a deflectable range of electron beams from the electron optical column 302 side. Therefore, with the movement of the XY stage 305, the main deflection region relatively moves in the stripe region 32 to be written. Further, each stripe region 32 is virtually divided by the size deflectable by the sub deflector 409 (second deflector) into a plurality of mesh-like sub-fields (SF) (sub-deflection region) (not shown). Then, shot figures are written at respective shot positions in each SF. Thus, a multiple stage deflector is configured by the two-stage deflector which deflects the electron beam 400. The deflection region is defined as the main deflection region or the SF in order from larger to smaller in size of the region to be deflected.

A digital signal for blanking control is output from the deflection control circuit 130 to an amplifier (not shown). Then, in the amplifier (not shown), the digital signal is converted to an analog signal and amplified to be applied as a deflection voltage to the blanking deflector 212. The electron beam 400 is deflected by this deflection voltage, and thereby a beam of each shot is formed.

A digital signal to control deflection for shaping is output from the deflection control circuit 130 to a DAC amplifier (not shown). Then, in the DAC amplifier (not shown), the digital signal is converted to an analog signal and amplified to be applied as a deflection voltage to the deflector 405. The electron beam 400 is deflected for shaping by this deflection voltage, and thereby a beam of each shot is variably shaped to be a desired shape and size.

A digital signal for controlling main deflection is output from the deflection control circuit 130 to the DAC amplifier 334. Then, in the DAC amplifier 334, the digital signal is converted to an analog signal and amplified to be applied as a deflection voltage to the main deflector 408. The electron beam 400 is deflected by this deflection voltage, and thereby each beam shot is deflected to a reference position (for example, a center position A of the SF concerned) of a predetermined sub-field (SF) obtained by a virtual division into mesh-like regions. Moreover, in the case of performing writing while continuously moving the XY stage 305, the deflection voltage also includes a deflection voltage for tracking to follow the movement of the stage.

A digital signal for controlling sub-deflection is output from the deflection control circuit 130 to the DAC amplifier 333. Then, in the DAC amplifier unit 333, the digital signal is converted to an analog signal and amplified to be applied as a deflection voltage to the sub deflector 409. The electron beam 400 is deflected by this deflection voltage, and thereby a beam of each shot is deflected to a corresponding shot position in the SF.

Specifically, the writing mechanism 150 operates as described below.

With respect to the electron beam 400 emitted from the electron gun 401 (emitter), when passing through the blanking deflector 412, the beam is controlled to pass through the opening in the first shaping aperture substrate 403 by the blanking deflector 412 if in the beam ON state, and the whole of the beam is deflected to be blocked by the first shaping aperture substrate 403 if in the beam OFF state. The electron beam 400 that has passed through the first shaping aperture substrate 403 during the period from changing a beam OFF condition to a beam ON condition to changing the beam ON condition to a beam OFF condition serves as one shot of the electron beam. The blanking deflector 412 controls the direction of the passing electron beam 400 to alternately generate a beam ON state and a beam OFF state. For example, when in a beam ON state, no voltage is applied to the blanking deflector 412, and, when in a beam OFF state, a voltage should be applied to it. The dose per shot of the electron beam 400 to irradiate the target object 101 is adjusted depending upon the irradiation time of each shot.

Figure 20:
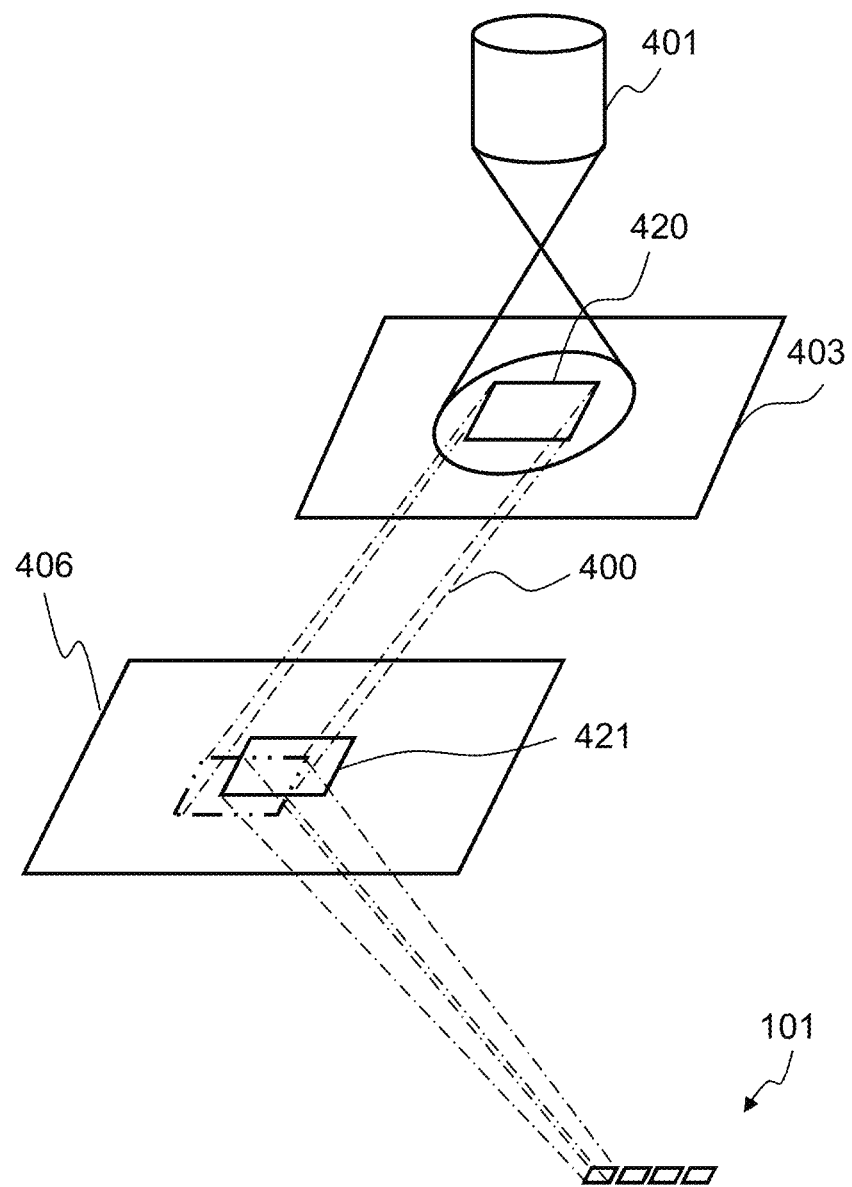
FIG. 20 illustrates a variable shaping operation according to the second embodiment.

FIG. 20 illustrates a variable shaping operation according to the second embodiment. As described above, the electron beam 400 controlled to be in beam ON state irradiates the whole of the first shaping aperture substrate 403 having a quadrangular (rectangular) opening 420 by the illumination lens 402. At this stage, the electron beam 400 is first shaped to a quadrangle. Then, after passing through the first shaping aperture substrate 403, the electron beam 400 of the first aperture image is projected onto the second shaping aperture substrate 406 by the projection lens 404. The first aperture image is deflected by the deflector 405 and passes through a part of a variable shape aperture 421 of the second shaping aperture substrate 406 so as to change (variably shape) the shape and size of the beam. That is, the quadrangular shape and size that can pass through both the aperture 420 of the first shaping aperture substrate 420 and the variable shape aperture 421 of the second shaping aperture substrate 406 are shape and side to be irradiated onto the target object 101. This method of forming a given shape by letting beams pass through both the aperture 420 of the first shaping aperture substrate 403 and the variable shape aperture 421 of the second shaping aperture substrate 406 is referred to as a variable shaped beam (VSB) system. Such variable shaping is performed for each shot, and each shot is generally shaped to have a different beam shape and size. Then, after passing through the second shaping aperture substrate 406, the electron beam 400 (variable shape beam) of the second aperture image is focused by the objective lens 407, and deflected by the main deflector 408 and the sub deflector 409 to reach a desired position on the target object 101 placed on the XY stage 305 which moves continuously. Thus, a plurality of shots of the electron beam 400 are deflected in order, by each deflector, onto the target object 101 serving as a substrate.

The writing apparatus 300 performs writing processing in each stripe region 32 by using a multiple stage deflector of a plurality of stages. Here, as an example, a two-stage deflector composed of the main deflector 408 and the sub deflector 409 is used. While the XY stage 305 is continuously moving in the −x direction, for example, writing is performed in the x direction in the first stripe region 32. After the writing has been finished in the first stripe region 32, continuously writing is performed in the same direction or in the opposite direction in the second stripe region 32. Then, in the same way, writing is performed in the third and subsequent stripe regions 32. The main deflector 408 (first deflector) sequentially deflects the electron beam 400 to the reference position of the SF such that the movement of the XY stage 305 is followed. The sub deflector 409 (second deflector) deflects the electron beam 400 from the reference position of each SF to a shot position of the beam with which the SF concerned is irradiated. Thus, the sizes of the deflection regions of the main deflector 408 and the sub deflector 409 are different from each other.

FIGS. 21A to 21C show other examples of a QC pattern according to the second embodiment. FIGS. 21A and 21B show QC patterns whose writing pattern type is set to "LINE AND SPACE PATTERN". FIG. 21C shows a QC pattern whose writing pattern type is set to "CONTACT PATTERN". In electron beam writing of VSB type which uses a single beam, there occurs no failure that only some beams are always in the ON state or always in the OFF state which occurs in the multiple beams 20. Therefore, it is not necessary to verify the position of a failure beam by using a solid pattern shown in FIG. 12, or a reverse solid pattern in FIG.

13. However, since variable shaping is performed, it is necessary to verify a shot size error and a shot position error. Then, in the example of FIG. 21A, line and space patterns repeated in the x direction by a predetermined width dimension are written. Even when the shot size of each beam is smaller than the measurement limit of the position measuring instrument, a line pattern (and a space pattern) of the width size equal to or larger than the measurement limit of the position measuring instrument can be written by setting the width size of the line pattern and the space pattern to be the size obtained by connecting a plurality of shots. Then, after developing and ashing the target object 101, the edge position of the formed resist pattern should be measured by the position measuring instrument.

Similarly, in the example of FIG. 21B, line and space patterns repeated in the y direction by a predetermined width dimension are written. Even when the shot size of each beam is smaller than the measurement limit of the position measuring instrument, a line pattern (and a space pattern) of the width size equal to or larger than the measurement limit of the position measuring instrument can be written by setting the width size of the line pattern and the space pattern to be the size obtained by connecting a plurality of shots. Then, after developing and ashing the target object 101, the edge position of the formed resist pattern should be measured by the position measuring instrument.

Now, as another one of the items for evaluating the apparatus quality of the VSB type writing apparatus 300, it can be mentioned that the CD dimension should be stable. When the CD dimension (width dimension) of a line pattern (and a space pattern) is deviated from the design dimension, local CD dimension variation may have occurred. Alternatively, CD dimension variation depending on process may have occurred. Alternatively, the focus position may be shifted. If a plurality of QC patterns are written with a time difference based on the writing timing, the CD dimension variation amount depending on time can be acquired. Furthermore, it is also preferable to simultaneously write line patterns sufficiently narrower than the line patterns described above. The resolution of the writing apparatus 300 can be verified by writing a plurality of line patterns having different width dimensions, and verifying the line width of a written narrow line pattern.

In the example of FIG. 21C, a quadrangular (rectangular, square) pattern (contact pattern) of the width size equal to or larger than the measurement limit of the position measuring instrument is written. Even when the shot size is smaller than the measurement limit of the position measuring instrument, a contact pattern of the size equal to or larger than the measurement limit of the position measuring instrument can be written by connectingly writing quadrangular (rectangular, square) patterns, such as shot figures each being 2×2. Then, after developing and asking the target object 101, the edge position of the formed resist pattern should be measured by the position measuring instrument.

As another one of the items for evaluating the apparatus quality of the VSB type writing apparatus 300, it can be mentioned that the local position of a variable shape beam has no deviation. Regarding this, as shown in FIG. 21C, for example, when the whole of 4×4 contact patterns is deviated, it turns out that the irradiation positions of the 4×4 contact patterns are locally deviated. If a plurality of QC patterns are written with a time difference based on the writing timing, the local position deviation amount depending on time can be acquired.

In the case of writing a plurality of QC patterns in the same SF, local position deviation in the sub-deflection region can be verified. In the case of writing respective QC patterns in different SFs, local position deviation in the main deflection region can be verified. Although in the example of FIG. 19 two-stage deflection of main and sub deflection is used, if a TF (sub-sub deflection region) of smaller deflection region is set and a sub-sub deflector is arranged, for example, local position deviation in the sub-sub deflection region can be verified.

For driving the DAC amplifier units 333 and 334, a settling time depending on a deflection swing width (amplitude) of each corresponding deflector is needed. For example, when the whole of the positions of 4×4 contact patterns is deviated, there is a possibility that the settling time of the DAC amplifier unit 333 for the sub-deflector 209 is insufficient. Therefore, whether the settling time is sufficient or not can be verified by checking position deviation of the contact pattern.

As described above, according to the second embodiment, it is possible in the writing apparatus 300 to automatically generate writing data of QC patterns used in the writing apparatus 300 of single beam type (variable shape beam system).

Third Embodiment

Each embodiment described above is on the premise of writing an actual chip pattern. Further, each embodiment described above explains the case where the system configuration capable of arranging a QC pattern of the writing apparatus is a configuration where the QC pattern can be set at an arbitrary position inside or outside of the chip region 30. However, the situation in which a QC pattern is needed is not limited thereto. For example, before writing a chip pattern, the quality of the writing apparatus needs to be verified. Then, by utilizing that the system configuration capable of arranging a QC pattern of the writing apparatus is a configuration which can set a QC pattern at an arbitrary position inside or outside of the chip region 30, a third embodiment describes the case of writing a QC pattern under the situation where no actual chip pattern is written. The configuration of the writing apparatus of the third embodiment is the same as that of the writing apparatus 100 of the first embodiment shown in FIG. 1 or that of the writing apparatus 300 of the second embodiment shown in FIG. 19. The contents of the present embodiment are the same as those of the first embodiment or the second embodiment except for what is specifically described below.

In the third embodiment, the following series of steps in the main steps of the writing method shown in FIG. 9, are executed: the QC information input step (S102), QC information file extraction step (S104), QC information interpretation step (S106), QC pattern data generation step (S108), writing data processing step (S130), and writing step (S132).

In the third embodiment, similarly to the first and second embodiments, the storage device 142 stores a plurality of QC information files (apparatus quality check pattern information files) in each of which there is defined a different one from others among a plurality of pieces of character information for specifying a plurality of QC patterns used for evaluating the apparatus quality of the writing apparatus.

In the QC information input step (S102), the user selects a QC information file through the data input I/F circuit 125.

Figures 22, 23:
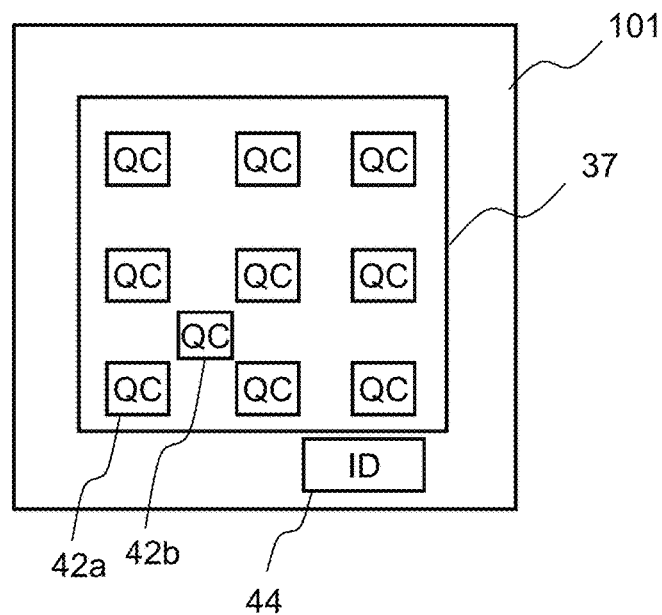
FIG. 22 shows an example of an input interface screen according to a third embodiment.
FIG. 23 shows an example of a pattern layout of a QC pattern according to the third embodiment.

FIG. 22 shows an example of an input interface screen according to the third embodiment. FIG. 22 shows an example of a QC layout generation screen in the case of writing a QC pattern without writing an actual chip pattern, where the screen is displayed by changing the screen of the data input I/F circuit 125 through an icon etc. (not shown). FIG. 22 shows the case where evaluation on global position deviation in a wide region on the surface of the target object 101, and evaluation on local position deviation in a narrow restricted region are performed as one of items for evaluating the apparatus quality of the writing apparatus 100 (or 300). The QC layout generation screen of the data input I/F circuit 125 (input unit) is configured to input a filename (identification information) for identifying an arbitrary QC information file from a plurality of QC information files, and to input layout information for specifying an arrangement layout of the QC pattern corresponding to the arbitrary QC information file concerned.

FIG. 22 shows a selection box for selecting a QC information file for global evaluation from a plurality of registered QC information files. In the example of FIG. 22, selecting can be performed by clicking on the icon denoted by "▼", and clicking one of filenames (identification information) of a plurality of listed QC information files. FIG. 22 shows the case of selecting a QC information file named "GLOBAL CD (LS PATTERN)" is selected. Next is shown an input box icon for determining the arrangement number of QC patterns for global evaluation. In the example of FIG. 22, selecting can be performed by clicking on the icon denoted by "▼", and clicking one of listed arrangement examples. FIG. 22 shows the case of selecting an arrangement of "3×3". Next are shown an input box icon for determining an arrangement pitch (layout information) of a QC pattern in the x direction for global evaluation, and an input box icon for determining an arrangement pitch (layout information) of the QC pattern in the y direction for global evaluation. FIG. 22 shows the case where the arrangement pitch of the QC pattern in the x direction is input as "X2", and the arrangement pitch of the QC pattern in the y direction is input as "Y2", through the K/B 122, etc. Next is shown an input box icon for determining a dose of the QC pattern for global evaluation. FIG. 22 shows the case where the dose of the QC pattern for global evaluation is input as "d2" through the K/B 122, etc.

Next, FIG. 22 shows a selection box for selecting a QC information file for local evaluation from a plurality of registered QC information files. In the example of FIG. 22, selecting can be performed by clicking on the icon denoted by "▼", and clicking one of filenames (identification information) of a plurality of listed QC information files. FIG. 22 shows the case of selecting a QC information file named "LOCAL POSITION (contact)". Next are shown an input box icon for determining an arrangement coordinate (layout information) of a QC pattern in the x direction for local evaluation, and an input box icon for determining an arrangement coordinate (layout information) of the QC pattern in the y direction for local evaluation. FIG. 22 shows the case where the arrangement coordinate (layout information) of the QC pattern in the x direction is input as "X3", and the arrangement coordinate (layout information) of the QC pattern in the y direction is input as "Y3", through the K/B 122, etc. Next is shown an input box icon for determining a dose of the QC pattern for local evaluation. FIG. 22 the case where the dose of the QC pattern for local evaluation is input as "d3" through the K/B 122, etc. Then, if there is no mistake in the input contents and selected contents, inputting in the QC information input step (S102) is completed by clicking "WRITING REGISTRATION" button (not shown).

In the QC information file extraction step (S104), the QC information file extraction unit 10 inputs the filename (identification information) of the QC information file selected on the screen of the data input I/F circuit 125, and extracts a corresponding QC information file from a plurality of QC information files stored in the storage device 142.

In the QC information interpretation step (S106), the QC information file interpretation unit 11 interprets character information and layout information defined in the extracted arbitrary QC information file. Specifically, in the character information defined in the extracted QC information file, with respect to the same information as the layout information input in the QC information input step (S102), giving priority to the layout information input in the QC information input step (S102), interpretation is performed for the contents of the character information defined in the QC information file.

FIG. 23 shows an example of a pattern layout of a QC pattern according to the third embodiment. Based on that the arrangement number of QC patterns 42*a* for global evaluation is set to "3×3", the arrangement pitch of the QC pattern in the x direction is set to "X2", and the arrangement pitch of the QC pattern in the y direction is set to "Y2" in the input screen of FIG. 22, 3×3 QC patterns 42*a* are arranged at that arrangement pitch in the writing region 37 for actual chip patterns. The 3×3 QC patterns 42*a* for global evaluation are automatically arranged such that the center of the array of the 3×3 QC patterns 42*a* is located near the center of the writing region 37 for the actual chip pattern. Although the position and size of the chip region 30 is different from each other depending on each chip, this can be handled by setting an average chip region 30 in advance and making the writing region 37 for an actual chip pattern be in accordance with the average chip region 30. Alternatively, in the case of writing a QC pattern for evaluation on an evaluation substrate before actually writing a chip pattern which has already been stored in the storage device 140, it is also preferable to automatically arrange the QC pattern in the region of the chip pattern to be actually written.

Furthermore, in the input screen of FIG. 22, a QC pattern 42*b* for local evaluation is arranged at the coordinates (X3, Y3) in the region 31.

Thus, simply, the 3×3 QC patterns 42*a* for global evaluation are automatically arranged in the writing region 37 for an actual chip pattern by inputting character information on QC pattern type, layout information and the like by using button selection, K/B 122, etc. Similarly, the QC pattern 42*b* for local evaluation is automatically arranged in the writing region 37 for the actual chip pattern.

In the QC pattern data generation step (S108), the QC pattern data generation unit 12 (writing data generation unit) generates, based on interpreted results, writing data of a QC pattern such that the QC pattern is arranged according to the arrangement layout based on the layout information input in the QC information input step (S102) in the writing region of the actual chip pattern. Writing data of the QC pattern is generated in the same format as that of chip writing data which is not used in the third embodiment.

In the case of writing an ID pattern together with the QC patterns, writing data for arranging the ID pattern in the ID pattern region 44 is generated as shown in FIG. 23.

In the writing data processing step (S130), with respect to writing data defining a QC pattern, the writing data processing unit 70 generates shot data (irradiation time data of each pixel) by performing data processing in multiple stages. The method of generating shot data is the same as that of the first embodiment or the second embodiment.

The writing data processing unit 70 creates the irradiation time data map (1) where the irradiation time for each pixel 36 is defined by way of converting an incident dose $D(x)$ for each pixel 36 into an irradiation time t by performing gradation by gray scale levels using a predetermined quantization unit A.

In the irradiation time data processing step, the writing data processing unit 70 reads the irradiation time data map (1), and rearranges it in order of shot in accordance with the writing sequence according to the first embodiment. Then, the writing control unit 72 transmits the irradiation time t data to the deflection control circuit 130 in order of shot.

In the writing step (S132), the deflection control circuit 130 outputs a blanking control signal to the blanking aperture array mechanism 204 in order of shot, and a deflection control signal to the DAC amplifier units 132 and 134 in order of shot. Then, based on writing data, the writing mechanism 150 writes with electron beams a QC pattern in the region 37 for writing an actual chip pattern on the target object 101, without writing an actual chip pattern.

As described above, according to the third embodiment, even when not writing a chip pattern on the target object 101, writing data of QC patterns used in the multi-beam writing apparatus 100 (or/and variable shape beam writing apparatus 300) can be automatically generated in the writing apparatus 100 (writing apparatus 300). Further, according to the third embodiment, one QC information file can be simply extracted from huge QC information files registered in the storage device 142 by inputting arrangement pitch, arrangement coordinate, etc. through the data input I/F circuit 125.

Embodiments have been explained referring to specific examples described above. However, the present invention is not limited to these specific examples.

While the case of inputting a 10-bit control signal into each control circuit 41 has been described above, the number of bits may be suitably set. For example, a 2-bit (or 3 to 9 bit) control signal may be used. Alternatively, a control signal of 11-bits or more may be used.

While the apparatus configuration, control method, and the like not directly necessary for explaining the present invention are not described, some or all of them can be selectively used case-by-case basis. For example, although description of the configuration of the control circuit for controlling the writing apparatus 100 is omitted, it should be understood that some or all of the configuration of the control circuit can be selected and used appropriately when necessary.

In addition, any other charged particle beam writing apparatus and charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a writing data generation circuitry configured to input one of character information and information of an item selected, for specifying an apparatus quality check pattern used for evaluating apparatus quality of a charged particle beam writing apparatus, and to generate writing data of the apparatus quality check pattern based on the one of the character information and the information of the item selected;
a combination circuitry configured to input writing data of an actual chip pattern to be written on a target object, and to combine the writing data of the actual chip pattern and the writing data of the apparatus quality check pattern such that the actual chip pattern and the apparatus quality check pattern do not overlap with each other; and
a writing mechanism configured to include a stage on which the target object is placed, an emission source which emits a charged particle beam, and a deflector which deflects the charged particle beam, and to write the actual chip pattern and the apparatus quality check pattern on the target object, with the charged particle beam, based on combined writing data.

2. The apparatus according to claim 1, wherein the writing mechanism writes the actual chip pattern and the apparatus quality check pattern on the target object with one of a variable shaped beam and multiple beams as the charged particle beam.

3. The apparatus according to claim 1, further comprising:
a correction circuitry configured to correct a writing position of the apparatus quality check pattern in the case where the actual chip pattern and the apparatus quality check pattern overlap with each other.

4. The apparatus according to claim 1, further comprising:
a setting circuitry configured to set a writing parameter for writing the apparatus quality check pattern independently of a writing parameter for writing the actual chip pattern.

5. The apparatus according to claim 1, further comprising:
a data input interface (I/F) circuit configured to make a user perform one of to input the character information and to select the item.

6. The apparatus according to claim 5, further comprising:
a storage device configured to store a plurality of apparatus quality check pattern information files in each of which there is defined a different one from others among a plurality of pieces of character information for specifying a plurality of apparatus quality check patterns each used for evaluating the apparatus quality of the writing apparatus; and
an extraction circuitry configured to extract an apparatus quality check pattern information file complying with the item selected in the plurality of apparatus quality check pattern information files.

7. The apparatus according to claim 6, wherein the character information defines a writing pattern type of the apparatus quality check pattern, a reference coordinate of the apparatus quality check pattern, a writing interval of the apparatus quality check pattern, and a number of patterns of the apparatus quality check pattern.

8. The apparatus according to claim 7, further comprising:
an interpretation circuitry configured to interpret contents of the character information,
wherein the writing data generation circuitry generates writing data of the apparatus quality check pattern, based on interpreted contents.

9. A charged particle beam writing method comprising:
inputting one of character information and information of an item selected, for specifying an apparatus quality check pattern used for evaluating apparatus quality of a charged particle beam writing apparatus, and generating writing data of the apparatus quality check pattern based on the one of the character information and the information of the item selected;

inputting writing data of an actual chip pattern to be written on a target object, and combining the writing data of the actual chip pattern and the writing data of the apparatus quality check pattern such that the actual chip pattern and the apparatus quality check pattern do not overlap with each other; and writing the actual chip pattern and the apparatus quality check pattern on the target object, with a charged particle beam, based on combined writing data.

10. A charged particle beam writing apparatus comprising:

a storage device configured to store a plurality of apparatus quality check pattern information files in each of which there is defined a different one from others among a plurality of pieces of character information for specifying a plurality of apparatus quality check patterns each used for evaluating apparatus quality of a charged particle beam writing apparatus;

an input circuitry configured to input identification information for identifying an arbitrary apparatus quality check pattern information file from the plurality of apparatus quality check pattern information files, and layout information for specifying an arrangement layout of an apparatus quality check pattern corresponding to the arbitrary apparatus quality check pattern information file;

an interpretation circuitry configured to interpret the character information and the layout information defined in the arbitrary apparatus quality check pattern information file;

a data generation circuitry configured to generate, based on interpreted results, writing data of the apparatus quality check pattern such that the apparatus quality check pattern is arranged according to the arrangement layout in a writing region for the actual chip pattern; and a writing mechanism configured to include a stage on which a target object is placed, an emission source which emits a charged particle beam, and a deflector which deflects the charged particle beam, and to write the apparatus quality check pattern in the writing region for the actual chip pattern on the target object, with the charged particle beam, based on the writing data, without writing the actual chip pattern.

* * * * *